(12) United States Patent
Tischler et al.

(10) Patent No.: US 10,234,113 B2
(45) Date of Patent: Mar. 19, 2019

(54) SEALED AND SEALABLE LIGHTING SYSTEMS INCORPORATING FLEXIBLE LIGHT SHEETS AND RELATED METHODS

(71) Applicants: Michael A. Tischler, Vancouver (CA); Paul Palfreyman, Vancouver (CA)

(72) Inventors: Michael A. Tischler, Vancouver (CA); Paul Palfreyman, Vancouver (CA)

(73) Assignee: COOLEDGE LIGHTING, INC., Burnaby, British Columbia (CA)

( * ) Notice: Subject to any disclaimer, the term of this patent is extended or adjusted under 35 U.S.C. 154(b) by 0 days.

(21) Appl. No.: 15/897,346

(22) Filed: Feb. 15, 2018

(65) Prior Publication Data

US 2018/0172245 A1   Jun. 21, 2018

Related U.S. Application Data

(63) Continuation of application No. 15/296,590, filed on Oct. 18, 2016, now Pat. No. 9,927,102, which is a
(Continued)

(51) Int. Cl.
*F21V 19/02* (2006.01)
*F21V 23/06* (2006.01)
(Continued)

(52) U.S. Cl.
CPC .............. *F21V 19/02* (2013.01); *E04B 9/241* (2013.01); *E04B 9/32* (2013.01); *F21S 8/026* (2013.01); *F21V 7/00* (2013.01); *F21V 15/01* (2013.01); *F21V 19/005* (2013.01); *F21V 23/001* (2013.01); *F21V 23/003* (2013.01); *F21V 23/06* (2013.01); *F21V 31/00* (2013.01);

*F21V 31/005* (2013.01); *F21V 33/006* (2013.01); *H05B 33/0827* (2013.01); *F21V 5/007* (2013.01); *F21V 5/008* (2013.01); *F21V 7/0083* (2013.01);
(Continued)

(58) Field of Classification Search
None
See application file for complete search history.

(56) References Cited

U.S. PATENT DOCUMENTS 4,103,171 A   7/1978   Schroeder
5,597,070 A   1/1997   Wu
(Continued)

FOREIGN PATENT DOCUMENTS

JP   2007-115550 A   5/2007
JP   2007-531321 A   11/2007
(Continued)

OTHER PUBLICATIONS

PCT International Patent Application No. PCT/US2014/041280, International Search Report and Written Opinion dated Oct. 22, 2014, 14 pages.
(Continued)

*Primary Examiner* — Crystal L Hammond
(74) *Attorney, Agent, or Firm* — Morgan, Lewis & Bockius LLP

(57) ABSTRACT

In accordance with certain embodiments, lighting systems include flexible light sheets and one or more sealed regions containing light-emitting elements, the sealed regions defined by seals between a top housing and a bottom housing and/or the light sheet.

54 Claims, 16 Drawing Sheets

Related U.S. Application Data continuation of application No. 14/301,859, filed on Jun. 11, 2014, now Pat. No. 9,506,633, and a continuation-in-part of application No. 14/195,175, filed on Mar. 3, 2014, now Pat. No. 8,884,534, which is a continuation of application No. 13/970,027, filed on Aug. 19, 2013, now Pat. No. 8,704,448, which is a continuation-in-part of application No. 13/799,807, filed on Mar. 13, 2013, now Pat. No. 8,947,001.

(60) Provisional application No. 61/834,183, filed on Jun. 12, 2013, provisional application No. 61/697,411, filed on Sep. 6, 2012.

(51) Int. Cl.

| | | |
|---|---|---|
| *E04B 9/24* | (2006.01) | |
| *E04B 9/32* | (2006.01) | |
| *F21V 31/00* | (2006.01) | |
| *F21V 19/00* | (2006.01) | |
| *H05B 33/08* | (2006.01) | |
| *F21V 33/00* | (2006.01) | |
| *F21V 15/01* | (2006.01) | |
| *F21S 8/02* | (2006.01) | |
| *F21V 7/00* | (2006.01) | |
| *F21V 23/00* | (2015.01) | |
| *F21V 5/00* | (2018.01) | |
| *F21V 17/10* | (2006.01) | |
| *H05K 3/28* | (2006.01) | |
| *F21Y 101/00* | (2016.01) | |
| *F21Y 105/10* | (2016.01) | |
| *F21Y 115/10* | (2016.01) | |

(52) U.S. Cl.
CPC ......... *F21V 17/101* (2013.01); *F21Y 2101/00* (2013.01); *F21Y 2105/10* (2016.08); *F21Y 2115/10* (2016.08); *H05K 3/284* (2013.01); *H05K 2201/10106* (2013.01); *H05K 2201/2054* (2013.01)

(56) References Cited

U.S. PATENT DOCUMENTS

| | | |
|---|---|---|
| 5,848,837 A | 12/1998 | Gustafson et al. |
| 5,927,845 A | 7/1999 | Gustafson et al. |
| 6,371,637 B1 | 4/2002 | Atchinson et al. |
| 6,539,147 B1* | 3/2003 | Mahony ............ G02B 6/4451 385/24 |
| 6,591,530 B1 | 7/2003 | Liao |
| 7,108,392 B2 | 9/2006 | Strip et al. |
| 7,109,528 B2 | 9/2006 | Nakata |
| 7,210,818 B2 | 5/2007 | Luk et al. |
| 7,460,743 B2 | 12/2008 | Lee |
| 7,777,166 B2 | 8/2010 | Roberts |
| 7,906,794 B2 | 3/2011 | Harrah et al. |
| 7,934,856 B2 | 5/2011 | Sanpei et al. |
| 8,049,112 B2 | 11/2011 | Yang |
| 8,093,823 B1 | 1/2012 | Ivey et al. |
| 8,115,370 B2 | 2/2012 | Huang |
| 8,123,375 B2 | 2/2012 | Negley et al. |
| 8,188,503 B2 | 5/2012 | Lynch et al. |
| 8,198,109 B2 | 6/2012 | Lerman et al. |
| 8,294,075 B2 | 10/2012 | Roberts |
| 8,338,199 B2 | 12/2012 | Lerman et al. |
| 8,461,602 B2 | 6/2013 | Lerman et al. |
| 8,461,613 B2 | 6/2013 | Chou et al. |
| 8,491,157 B2 | 7/2013 | Oba et al. |
| 8,692,457 B2 | 4/2014 | Aurongzeb et al. |
| 8,704,448 B2 | 4/2014 | Tischler et al. |
| 8,786,200 B2 | 7/2014 | Tischler et al. |
| 8,789,988 B2 | 7/2014 | Goldwater |
| 8,884,534 B2 | 11/2014 | Tischler et al. |
| 8,947,001 B2 | 2/2015 | Tischler et al. |
| 9,224,934 B2 | 12/2015 | Tischler et al. |
| 9,379,289 B1 | 6/2016 | Lindblad et al. |
| 9,395,057 B2 | 7/2016 | van de Ven et al. |
| 9,506,633 B2 | 11/2016 | Tischler et al. |
| 9,538,596 B2 | 1/2017 | Radermacher et al. |
| 9,539,932 B2 | 1/2017 | Fay |
| 2005/0211998 A1 | 9/2005 | Daniels et al. |
| 2005/0212007 A1 | 9/2005 | Daniels et al. |
| 2005/0214962 A1 | 9/2005 | Daniels et al. |
| 2005/0214963 A1 | 9/2005 | Daniels et al. |
| 2005/0265029 A1 | 12/2005 | Epstein et al. |
| 2006/0197456 A1 | 9/2006 | Cok |
| 2007/0090387 A1 | 4/2007 | Daniels et al. |
| 2007/0105250 A1 | 5/2007 | Daniels et al. |
| 2007/0290217 A1 | 12/2007 | Daniels |
| 2008/0067526 A1* | 3/2008 | Chew .................... H05K 1/189 257/88 |
| 2008/0087903 A1 | 4/2008 | Stoyan |
| 2008/0101070 A1 | 5/2008 | Chou |
| 2008/0107373 A1 | 5/2008 | Lee |
| 2008/0191220 A1 | 8/2008 | Daniels et al. |
| 2008/0259576 A1 | 10/2008 | Johnson et al. |
| 2009/0116244 A1 | 5/2009 | Hsiao et al. |
| 2009/0261743 A1 | 10/2009 | Chen et al. |
| 2009/0272987 A1 | 11/2009 | Wang |
| 2010/0031996 A1 | 2/2010 | Basol |
| 2010/0065873 A1 | 3/2010 | Bhattacharya et al. |
| 2010/0147364 A1 | 6/2010 | Gonzalez et al. |
| 2010/0274447 A1 | 10/2010 | Stumpf |
| 2010/0294913 A1 | 11/2010 | Roberts |
| 2010/0311494 A1 | 12/2010 | Miller et al. |
| 2011/0008926 A1 | 1/2011 | Irvin et al. |
| 2011/0037409 A1 | 2/2011 | Van et al. |
| 2011/0058372 A1 | 3/2011 | Lerman et al. |
| 2011/0163682 A1 | 7/2011 | Jungwirth |
| 2011/0163683 A1 | 7/2011 | Steele et al. |
| 2011/0193105 A1 | 8/2011 | Lerman et al. |
| 2011/0254470 A1 | 10/2011 | Penoyer |
| 2012/0043115 A1 | 2/2012 | Chen et al. |
| 2012/0057239 A1 | 3/2012 | Shiojiri et al. |
| 2012/0060895 A1 | 3/2012 | Rubin et al. |
| 2012/0146066 A1 | 6/2012 | Tischler et al. |
| 2012/0182739 A1 | 7/2012 | Leung et al. |
| 2012/0293086 A1 | 11/2012 | Ishikita et al. |
| 2013/0140430 A1 | 6/2013 | Roberts |
| 2013/0181619 A1 | 7/2013 | Tischler et al. |
| 2013/0256710 A1 | 10/2013 | Andrews et al. |
| 2014/0062315 A1 | 3/2014 | Tischler et al. |
| 2014/0062316 A1 | 3/2014 | Tischler et al. |
| 2014/0062318 A1 | 3/2014 | Tischler et al. |
| 2014/0097454 A1 | 4/2014 | Hussell |
| 2014/0175993 A1 | 6/2014 | Tischler et al. |
| 2014/0362566 A1 | 12/2014 | Tischler et al. |
| 2014/0369033 A1 | 12/2014 | Palfreyman et al. |
| 2014/0369038 A1 | 12/2014 | Tischler et al. |
| 2015/0077991 A1 | 3/2015 | Palfreyman et al. |
| 2015/0108906 A1 | 4/2015 | Tischler et al. |
| 2015/0108907 A1 | 4/2015 | Tischler et al. |
| 2017/0051898 A1 | 2/2017 | Tischler et al. |

FOREIGN PATENT DOCUMENTS

| | | |
|---|---|---|
| JP | 2007-335866 A | 12/2007 |
| JP | 2011-65829 A | 3/2011 |
| JP | 2012-43756 A | 3/2012 |
| KR | 10-2010-0129414 A | 12/2010 |
| WO | 1998/23896 A1 | 6/1998 |
| WO | 2013/001528 A1 | 1/2013 |
| WO | 2013/021311 A2 | 2/2013 |
| WO | 2014/039298 A1 | 3/2014 |
| WO | 2014/200846 A1 | 12/2014 |

(56) References Cited

FOREIGN PATENT DOCUMENTS

WO  2014/201112 A1  12/2014
WO  2014/201250 A1  12/2014

OTHER PUBLICATIONS

PCT International Patent Application No. PCT/US2014/041903, International Search Report and Written Opinion dated Nov. 12, 2014, 22 pages.
PCT International Patent Application No. PCT/US2014/042126, International Search Report and Written Opinion dated Oct. 27, 2014, 9 pages.
PCT International Patent Application No. PCT/US2013/056567, International Search Report and Written Opinion dated Dec. 23, 2013, 10 pages.

* cited by examiner

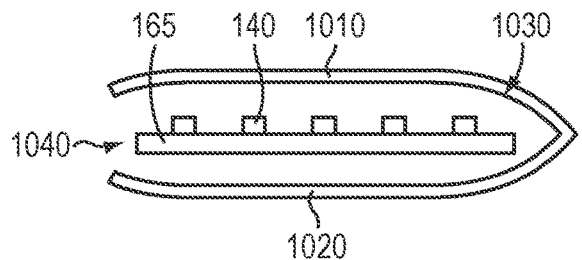
FIG. 10A
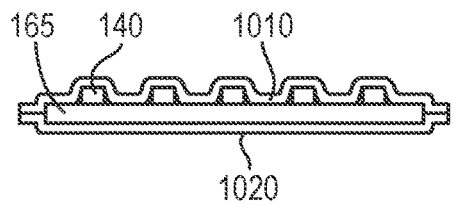
FIG. 10B
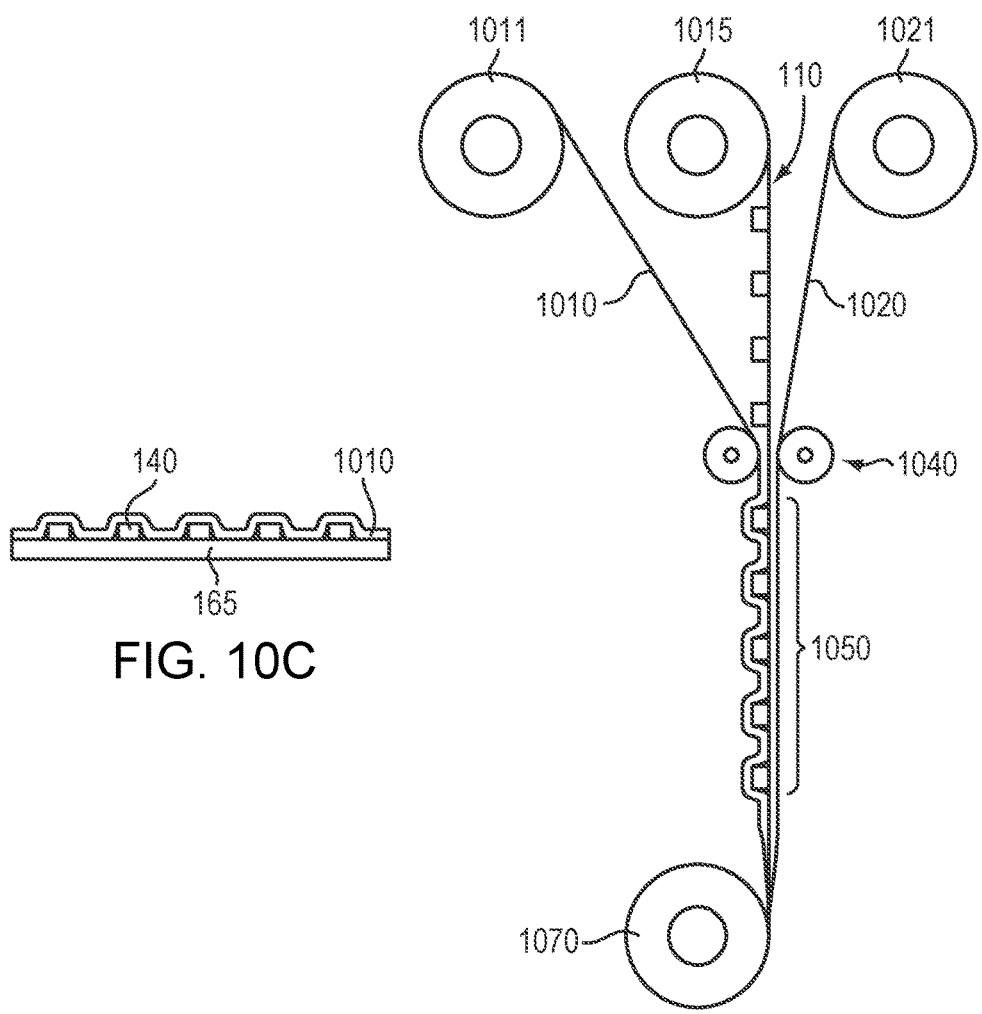
FIG. 10C
FIG. 10D

SEALED AND SEALABLE LIGHTING SYSTEMS INCORPORATING FLEXIBLE LIGHT SHEETS AND RELATED METHODS

RELATED APPLICATIONS

This application is a continuation of U.S. patent application Ser. No. 15/296,590, filed Oct. 18, 2016, which is a continuation of U.S. patent application Ser. No. 14/301,859, filed Jun. 11, 2014, which claims the benefit of and priority to U.S. Provisional Patent Application No. 61/834,183, filed Jun. 12, 2013, the entire disclosure of which is hereby incorporated herein by reference. U.S. patent application Ser. No. 14/301,859, filed Jun. 11, 2014, is also a continuation-in-part of U.S. patent application Ser. No. 14/195,175, filed on Mar. 3, 2014, which is a continuation of U.S. patent application Ser. No. 13/970,027, filed Aug. 19, 2013, now issued as U.S. Pat. No. 8,704,448, which is a continuation-in-part of U.S. patent application Ser. No. 13/799,807, filed Mar. 13, 2013, which claims the benefit of and priority to U.S. Provisional Patent Application No. 61/697,411, filed Sep. 6, 2012, the entire disclosure of each of which is hereby incorporated herein by reference.

FIELD OF THE INVENTION

In various embodiments, the present invention generally relates to electronic devices, and more specifically to array-based electronic devices.

BACKGROUND

Solid-state lighting is an attractive alternative to incandescent and fluorescent lighting systems for a wide range of lighting applications because of its relatively higher efficiency, robustness, and long life. However, conventional solid-state lighting systems featuring light-emitting diodes (LEDs) have a number of limitations related to thermal management of heat generated by the LEDs and the need to control the distribution of light and ensure low glare.

In many lighting applications it is desirable to have lighting systems or luminaires that are thin, low-volume, and lightweight in order to meet certain aesthetic design requirements or so that the lighting system is unobtrusive. In other applications it is desirable to be able to conform the illumination source to a curved surface. Current LED systems generally include LEDs that are operated at relatively high current and thus very high brightness. High-current operation is often preferred in order to reduce the LED count and thus reduce the overall cost of the lighting system. However, this results in the generation of significant amounts of heat that must be extracted from the LED. In contrast to incandescent lamps, which radiate heat into the environment, the heat from LEDs in large measure must be extracted by conduction, which generally requires relatively large amounts of material with a high thermal conductivity, such as metal core printed circuit boards (MCPCBs), heat sinks, and in some cases active (e.g., forced-air) cooling. Such thermal-management solutions typically are not sufficiently flexible to permit conforming to curved surfaces, and they take up significantly more space than the LEDs themselves, resulting in increased size and volume of LED-based lighting systems. These solutions may also increase system cost and potentially reduce reliability and operational lifetime of the lighting system. The high junction temperatures associated with high-current operation also reduce LED lifetime.

Furthermore, if not appropriately managed, high-brightness illumination sources do not provide the desired light distribution pattern and may produce significant and unacceptable levels of glare. Such optical challenges have been addressed in a number of ways. For example, many lighting systems utilize a diffuser in front of the LEDs, but in order to effectively reduce pixelization (i.e., the visualization of the individual LEDs), the diffuser must have relatively low transmittance, which decreases efficiency. Some lighting systems utilize a large mixing volume for the emitted light, which increases the size and cost of the illumination system, or utilize relatively sophisticated and costly optics to control the light-distribution pattern.

Thin, low-volume, and lightweight lighting elements are also beneficial from a building design and cost perspective. Virtually all buildings require unoccupied space to support heating, ventilation, and air conditioning (HVAC) systems, electrical and communications wiring, plumbing, and other facilities. From a cost perspective it is desirable to minimize this unoccupied space, which often results in these spaces becoming very crowded and densely packed, which can lead to difficulties in initial installation and subsequent repair and modification of the systems within the space. In some construction processes, lighting is installed closer to the end of the project, in which case the unoccupied spaces may already be substantially filled, resulting in significant installation difficulty. Lighting systems that require significant volume in the unoccupied space may thus increase the building cost by requiring additional unoccupied space, or pose installation challenges if sufficient space has not been allotted in advance.

Space constraints also apply in building renovation. In these cases the spacing between floors is generally fixed and cannot be changed. In particular, many older buildings were not designed to support the required range of facilities in more modern buildings. More unoccupied space can sometimes be created, but typically at the expense of the occupied space, for example by reducing the ceiling height.

In view of the foregoing, a need exists for systems and techniques enabling the low-cost design and manufacture of compact, reliable, high-brightness lighting systems having low glare and the ability to produce different light-distribution patterns.

SUMMARY

In accordance with certain embodiments of the present invention, lighting systems incorporate flexible light sheets having light-emitting elements (e.g., bare-die light-emitting diodes) thereon. Top and or bottom housings, either or both of which may be polymeric, are utilized to seal at least portions of the light sheets and form sealed regions that may be water-resistant or waterproof. The housings may also be shaped to reflect, diffuse, and/or shape the light emitted by the light-emitting elements. The housings may even define structural features such as protruding ribs for mechanical stability. While most, if not all, of the light-emitting elements of the light sheets are preferably safely located within the sealed regions, the lighting systems typically incorporate conductive couplings that extend out of the sealed regions (without disrupting the seal over the light-emitting elements) and enable the provision of power from an external power source to the light-emitting elements. Lighting systems in accordance with embodiments of the invention may thus be advantageously deployed in harsher and/or moist environments where exposure to dirt, dust, moisture, etc. is possible or frequent. The lighting systems may be fabricated in bulk by, e.g., roll-to-roll processes and even separated from larger "sheets" of the lighting device components, preferably without disrupting the seal on and/or around each individual lighting system (or "partial" lighting system). As used herein, a "sealed region" refers to a portion of a light sheet or lighting system having a periphery at least partially defined by a seal between two housings, a housing and the light sheet, and/or a housing, light sheet, and/or another sealing material (e.g., a transparent material disposed between the light sheet and a housing. A sealed region may also include a portion of a light sheet coated with a housing, i.e., the housing may be a coating or sealant material conformally or non-conformally coating (and thus directly contacting) the portion of the light sheet (and, e.g., light-emitting elements, conductive traces, etc. on the light sheet) thereunder.

In an aspect, embodiments of the invention feature a lighting system including or consisting essentially of a substantially planar flexible substrate having a first surface and a second surface opposite the first surface, first and second spaced-apart power conductors disposed over the first surface of the substrate, a plurality of light-emitting strings forming a two-dimensional array over the first surface of the substrate, a plurality of conductive traces disposed over the first surface of the substrate, a polymeric top housing disposed over the first surface of the substrate, and one or more conductive couplings for supplying power from an external power source to the light-emitting strings. Each light-emitting string (i) includes or consists essentially of a plurality of interconnected light-emitting elements spaced along the light-emitting string, (ii) has a first end electrically coupled to the first power conductor, and (iii) has a second end electrically coupled to the second power conductor. The power conductors supply power to each of the light-emitting strings. Each conductive trace electrically interconnects two light-emitting elements, or electrically connects a light-emitting element to a power conductor. The top housing seals (e.g., gaplessly seals), within a sealed region between the top housing and the substrate, the plurality of light-emitting strings, the plurality of control elements, the plurality of conductive traces, at least a portion of the first power conductor, and at least a portion of the second power conductor. One or more of the conductive couplings extend from within the sealed region to outside of the sealed region.

Embodiments of the invention may include one or more of the following in any of a variety of combinations. The sealed region may be water-resistant or waterproof. The sealed region may include or consist essentially of multiple individually sealed "sub-regions" each at least partially sealed from the others. The lighting system may include a plurality of control elements each (i) electrically connected to at least one light-emitting string and (ii) configured to utilize power supplied from the power conductors to control the current to the at least one light-emitting string to which it is electrically connected. One or more (or even all) of the control elements may be disposed within the sealed region. A plurality of additional conductive traces may be disposed over the first surface of the substrate. Each additional conductive trace may (i) electrically interconnect a light-emitting element and a control element, or (ii) electrically connect a control element to a power conductor. The control elements and the additional conductive traces may be disposed within the sealed region. The first and second power conductors may be disposed entirely within the sealed region. The first and second power conductors may extend along opposing edges of the first surface of the substrate. The first and second power conductors may extend in a first direction, and at least a portion of each of the plurality of light-emitting strings may extend in a second direction not parallel to (e.g., perpendicular to) the first direction. The top housing may be disposed in contact with, in the sealed region, the plurality of light-emitting strings, the plurality of control elements, the plurality of conductive traces, the at least a portion of the first power conductor, and/or the at least a portion of the second power conductor. The top housing may be spaced apart from the light-emitting strings and at least some of the conductive traces in the sealed region.

The lighting system may include a power supply for powering the light-emitting elements and that is electrically connected to the first and second power conductors. The power supply may be disposed within or outside of the sealed region. The power supply may include or consist essentially of a battery. The power supply may be configured to provide a substantially constant voltage to the power conductors. At least one conductive coupling may be a portion of the first power conductor and/or a portion of the second power conductor. At least one conductive coupling may be a wire electrically connected to at least one of the first or second power conductors within the sealed region and extending outside of the sealed region. At least one conductive coupling may include or consist essentially of a conductive element (e.g., a rivet, staple, or crimp-type connector) piercing through at least one of the top housing or the substrate and making electrical contact to at least one of the first or second power conductors. At least one conductive coupling may include or consist essentially of an electrical connector terminating outside of the sealed region and configured to receive a complementary connector or wire electrically connected to the external power source.

The lighting system may include a polymeric bottom housing disposed over the second surface of the substrate (i.e., with the substrate disposed between the top and bottom housings). At least a portion of the bottom housing may contact the second surface of the substrate to form a second sealed region disposed between the bottom housing and the second surface of the substrate. The second sealed region may include or consist essentially of multiple individually sealed "sub-regions" each at least partially sealed from the others. The sealed region and the second sealed region may be water-resistant or waterproof. The bottom housing may be spaced away from the second surface of the substrate in the second sealed region. The bottom housing may be in contact with the second surface of the substrate in at least a portion of the second sealed region. The bottom housing may include or consist essentially of polyester, acrylic, polystyrene, polyethylene, polyimide, polyethylene naphthalate, polyethylene terephthalate, polypropylene, polycarbonate, acrylonitrile butadiene styrene, polyurethane, silicone, and/or polydimethylsiloxane.

At least a portion of the bottom housing may contact the top housing (instead of or in addition to contacting the substrate) to form a second sealed region disposed between the bottom housing and the second surface of the substrate. The sealed region and the second sealed region may be water-resistant or waterproof. The bottom housing may be spaced away from the second surface of the substrate in the second sealed region. The bottom housing may be in contact with the second surface of the substrate in at least a portion of the second sealed region. At least a portion of the bottom housing may define a plurality of protruding ribs. The bottom housing may include or consist essentially of polyester, acrylic, polystyrene, polyethylene, polyimide, polyethylene naphthalate, polyethylene terephthalate, polypropylene, polycarbonate, acrylonitrile butadiene styrene, polyurethane, silicone, and/or polydimethylsiloxane.

The lighting system may include (i) control circuitry configured to control at least one emission characteristic of the light-emitting elements, and/or (ii) communication circuitry configured to transmit information to or from the lighting system. The at least one emission characteristic may include or consist essentially of a correlated color temperature (CCT), a color rendering index (CRI), R9, a luminous flux, a light-output power, a spectral power density, a radiant flux, a light-distribution pattern, and/or an angular color uniformity. The lighting system may have an ingress protection rating of at least IP 65, as specified by International Protection Marking in International Electrotechnical Commission (IEC) standard 60529. The plurality of light-emitting strings may form a fixed pattern in the shape of one or more symbols and/or letters. The weight per area of the lighting system may be less than 5 kg/m$^2$, less than 3 kg/m$^2$, or less than 1.5 kg/m$^2$. The thickness of the lighting system (including the top housing and/or a bottom housing) may be less than 25 mm, less than 15 mm, less than 10 mm, or less than 5 mm. At least a portion of the top housing may be configured as a diffuser for a wavelength of light emitted by the light-emitting elements. A transmittance of the top housing for a wavelength of light emitted by the light-emitting elements may be greater than 90%. The light-emitting elements in each of the light-emitting strings may be separated by a substantially constant pitch. The top housing may be spaced apart from the light-emitting elements by an amount ranging from the pitch between light-emitting elements to twice the pitch between light-emitting elements.

At least one light-emitting element may emit substantially white light. A correlated color temperature of the substantially white light may be in the range of 2000 K to 10,000 K. At least one light-emitting element may include or consist essentially of a bare-die light-emitting diode. At least one light-emitting element may include or consist essentially of a packaged light-emitting diode. In at least one light-emitting string, each light-emitting element may be coupled to one or more conductive traces via solder and/or an adhesive. Each light-emitting element in one or more light-emitting strings may be coupled to one or more conductive traces via an anisotropic conductive adhesive. The conductive traces may include or consist essentially of copper, brass, aluminum, silver, and/or gold. The thickness of the conductive traces may be less than 50 µm, and the substrate may include or consist essentially of polyethylene terephthalate. The sealed region may include an inert gas therewithin. The sealed region may be at least partially filled with a flexible transparent material (which may be separate and discrete from the top housing, bottom housing, and/or substrate) having a transmittance of at least 90% to a wavelength of light emitted by the light-emitting elements. The sealed region may be filled with the transparent material the transparent material may occupy any space between the light sheet and the top housing in the sealed region). The transparent material may include or consist essentially of silicone, polyurethane, and/or epoxy. A desiccant may be disposed in the sealed region. At least a portion of the top housing may define a plurality of protruding ribs.

At least a portion of an interior surface of the top housing may have a reflectance greater than 90% to a wavelength of light emitted by the light-emitting elements, and/or at least a portion of the substrate may have a transmittance greater than 90% to a wavelength of light emitted by the light-emitting elements. A portion of the top housing may be shaped to reflect light emitted by the light-emitting elements toward the substrate. The top housing may include or consist essentially of a plurality of shaped regions each associated with a light-emitting element. Each shaped region may include or consist essentially of a hemisphere, a portion of a sphere, or a paraboloid. Each shaped region may include or consist essentially of a paraboloid, and the light-emitting element associated therewith may be positioned at a focal point of the paraboloid. An optical element may be disposed between the light-emitting elements and the top housing. A plurality of optical elements may be disposed between the light-emitting elements and the top housing, and each optical element may be associated with one or more light-emitting elements. The top housing may define a plurality of shaped regions, each shaped region may be associated with a light-emitting element and may form at least a portion of an optical element thereover, and the top housing may have a transmittance greater than 90% to a wavelength of light emitted by the light-emitting elements. The shaped regions may each include or consist essentially of a hemisphere, a portion of a sphere, or a paraboloid. A flexible transparent material having a transmittance of at least 90% to a wavelength of light emitted by the light-emitting elements may be disposed between the polymeric top housing and the light-emitting elements. The transparent material may include or consist essentially of silicone, polyurethane, and/or epoxy. The transparent material may have a refractive index of at least 1.4.

The lighting system may be separable, via a cut spanning the first and second power conductors and not crossing a light-emitting string, into two individually operable partial lighting systems. Each partial lighting system may include or consist essentially of (i) one or more light-emitting strings, (ii) portions of the first and second power conductors configured to supply power to and thereby illuminate the one or more light-emitting strings of the partial lighting system. (iii) a sealed region defined by a seal between a portion of the top housing and the substrate, and (iv) extending from within the sealed region to outside of the sealed region, one or more of the conductive couplings. One or more control elements may be disposed in each partial lighting system. Each control element may be (i) electrically connected to at least one light-emitting string and (ii) configured to utilize power supplied from the power conductors to control the current to the at least one light-emitting string to which it is electrically connected. The lighting system may be flexible. The top housing may include or consist essentially of polyester, acrylic, polystyrene, polyethylene, polyimide, polyethylene naphthalate, polyethylene terephthalate, polypropylene, polycarbonate, acrylonitrile butadiene styrene, polyurethane, silicone, and/or polydimethylsiloxane.

The top housing may include or consist essentially of a transparent flexible material. The transparent material may include or consist essentially of silicone, polyurethane, and/or epoxy. The top housing may conformally coat at least a portion of the first surface of the light sheet. At least one conductive coupling may be configured to convey a communication or control signal to or from the light sheet. The communication or control signal may include or consist essentially of a light-intensity level, a correlated color temperature (CCT), a color rendering index (CRI), a luminous-intensity distribution, and/or an operational state of the light sheet. One or more second conductive couplings configured to convey a communication or control signal to or from the light sheet may extend from within the sealed region to outside of the sealed region. The communication or control signal may include or consist essentially of a light-intensity level, a correlated color temperature (CCT), a color rendering index (CRI), a luminous-intensity distribution, and/or an operational state of the light sheet.

In another aspect, embodiments of the invention feature a method for manufacturing a lighting system. A light sheet is provided. The light sheet includes or consists essentially of a substantially planar flexible substrate having a first surface and a second surface opposite the first surface, first and second spaced spaced-apart power conductors disposed over the first surface of the substrate, a plurality of light-emitting elements disposed over the first surface of the substrate, and a plurality of conductive traces disposed over the first surface of the substrate and each (i) electrically interconnecting two light-emitting elements, or (ii) electrically connecting a light-emitting element to a power conductor. The light-emitting elements may be interconnected (e.g., serially connected) in one or more light-emitting strings. Optionally, a polymeric bottom housing is provided below a bottom surface of the light sheet. A polymeric top housing is provided above a top surface of the light sheet opposite the bottom surface of the light sheet. At least a portion of the top housing is sealed to the light sheet and/or the bottom housing to form one or more sealed regions containing the light-emitting elements.

Embodiments of the invention may include one or more of the following in any of a variety of combinations. The bottom housing may be provided, the at least a portion of the top housing may be sealed to the light sheet, and at least a portion of the bottom housing may be sealed to the light sheet. At least a portion of the bottom housing may be sealed to the light sheet to thereby form one or more second sealed regions disposed between the bottom of the light sheet and the bottom housing. At least a portion of the bottom housing may be sealed to the top housing. One or more of the sealed regions may be filled with an inert gas. One or more of the sealed regions may be partially or substantially filled with a flexible transparent material having a transmittance of at least 90% to a wavelength of light emitted by the light-emitting elements. The lighting system may be separated into a plurality of individually operable partial lighting systems each including or consisting essentially of (i) one or more light-emitting elements, (ii) portions of the first and second power conductors configured to supply power to and thereby illuminate the one or more light-emitting elements of the partial lighting system, and (iii) one or more of the sealed regions. The transparent material may maintain (e.g., form a portion of) the seal between the top housing and the light sheet and/or the bottom housing in the one or more sealed regions notwithstanding the separation.

One or more conductive couplings for (i) supplying power from an external power source to one or more light-emitting elements and/or (ii) conveying a communication or control signal to or from the light sheet may be provided. Each conductive coupling may extend from within a sealed region to outside of the sealed region. The communication or control signal may include or consist essentially of a light-intensity level, a correlated color temperature, a color rendering index, a luminous-intensity distribution, and/or an operational state of the light sheet. The lighting system may be separated into a plurality of individually operable partial lighting systems each including or consisting essentially of (i) one or more light-emitting elements, (ii) portions of the first and second power conductors configured to supply power to and thereby illuminate the one or more light-emitting elements of the partial lighting system, (iii) one or more of the sealed regions, and (iv) one or more of the conductive couplings. At least one conductive coupling may be provided before the one or more sealed regions are formed. At least one conductive coupling may be provided after the one or more sealed regions are formed.

The lighting system may be separated into a plurality of individually operable partial lighting systems each including or consisting essentially of (i) one or more light-emitting elements, (ii) portions of the first and second power conductors configured to supply power to and thereby illuminate the one or more light-emitting elements of the partial lighting system, and (iii) one or more of the sealed regions. The light-emitting elements may be interconnected to form a plurality of light-emitting strings. Each light-emitting string (i) may comprise a plurality of interconnected light-emitting elements spaced along the light-emitting string, (ii) may have a first end electrically coupled to the first power conductor, and (iii) may have a second end electrically coupled to the second power conductor. The power conductors may supply power to each of the light-emitting strings. The light sheet may include thereon one or more control elements each (i) electrically connected to a different light-emitting string and (ii) configured to utilize power supplied from the power conductors to provide a substantially constant current to the light-emitting string to which it is electrically connected. Providing the top housing may include, before the one or more sealed regions are formed, shaping the top housing to define (i) one or more protruding ribs and/or (ii) one or more optical elements. Providing the top housing may include, before the one or more sealed regions are formed, coating at least a portion of the top housing with a coating having a reflectance greater than 90% to a wavelength of light emitted by the light-emitting elements.

Each sealed region may be water-resistant or waterproof. Sealing at least a portion of the top housing to the light sheet and/or the bottom housing may include or consist essentially of heat welding, high-frequency welding, ultrasonic welding, laser welding, heat staking, gluing, and/or taping. Formation of the one or more sealed regions may include or consist essentially of laminating the top housing to the top surface of the light sheet. A transparent material having a transmittance of at least 90% to a wavelength of light emitted by the light-emitting elements may be disposed over the first surface of the substrate. The transparent material may be provided before forming the one or more sealed regions. The transparent material may include or consist essentially of silicone, polyurethane, and/or epoxy. The transparent material may be disposed over the substrate via dip coating, spray coating, brush coating, and/or printing. The transparent material may substantially conform to a non-planar topography of the light-emitting elements thereunder. The top surface of the transparent material may be planar notwithstanding a non-planar topography of the light-emitting elements thereunder. The transparent material may also be disposed over at least a portion of the second surface of the substrate. The transparent material may form a water-resistant or waterproof coating. One or more sealed regions may each have an ingress protection rating of at least IP 65, as specified by International Protection Marking in International Electrotechnical Commission (IEC) standard 60529.

The light sheet may be provided on a first roll, the top housing may be provided on a second roll, and the top housing may be sealed to the light sheet. Sealing the top housing to the light sheet may include or consist essentially of, in a roll-to-roll process, (a) feeding light sheet from the first roll and top housing from the second roll to a mating point, and at the mating point or thereafter, (b) sealing the mated light sheet and top housing. The lighting system may be separated into a plurality of individually operable partial lighting systems each including or consisting essentially of (i) one or more light-emitting elements, (ii) portions of the first and second power conductors configured to supply power to and thereby illuminate the one or more light-emitting elements of the partial lighting system, and (iii) one or more of the sealed regions. One or more conductive couplings each (i) supplying power from an external power source to one or more light-emitting elements and/or (ii) conveying a communication or control signal to or from the light sheet may be provided. Each conductive coupling may extend from within a sealed region to outside of the sealed region. At least one conductive coupling may be provided before the one or more sealed regions are formed. At least one conductive coupling may be provided after the one or more sealed regions are formed. Each partial lighting system may include one or more of the conductive couplings. The communication or control signal may include or consist essentially of a light-intensity level, a correlated color temperature, a color rendering index, a luminous-intensity distribution, or an operational state of the light sheet.

The light sheet may be provided on a first roll, the top housing may be provided on a second roll, the bottom housing may be provided on a third roll, and sealing the top housing to the light sheet and/or the bottom housing may include or consist essentially of, in a roll-to-roll process, (a) feeding light sheet from the first roll, top housing from the second roll, and bottom housing from the third roll to a mating point, and at the mating point or thereafter, (b) sealing the top housing to at least one of the light sheet or the bottom housing. The lighting system may be separated into a plurality of individually operable partial lighting systems each including or consisting essentially of (i) one or more light-emitting elements, (ii) portions of the first and second power conductors configured to supply power to and thereby illuminate the one or more light-emitting elements of the partial lighting system, and (iii) one or more of the scaled regions. One or more conductive couplings each (i) supplying power from an external power source to one or more light-emitting elements and/or (ii) conveying a communication or control signal to or from the light sheet may be provided. Each conductive coupling may extend from within a sealed region to outside of the sealed region. At least one conductive coupling may be provided before the one or more sealed regions are formed. At least one conductive coupling may be provided after the one or more sealed regions are formed. Each partial lighting system may include one or more of the conductive couplings. The communication or control signal may include or consist essentially of a light-intensity level, a correlated color temperature, a color rendering index, a luminous-intensity distribution, or an operational state of the light sheet.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light Or other electromagnetic signal) emitted by or passing through one component passes through and/or is emitted by the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 10A and 10B are schematic cross-sections of a laminated lighting device during two stages of manufacture in accordance with various embodiments of the invention;

FIG. 10C is a schematic cross-section of a laminated lighting device in accordance with various embodiments of the invention;

FIG. 10D is a schematic diagram of a roll-to-roll processing apparatus for the fabrication of laminated lighting devices in accordance with various embodiments of the invention;

DETAILED DESCRIPTION

Various embodiments of the present invention feature a thin light sheet that does not require any additional heat sinking or thermal management. In some embodiments, the light sheet may also be flexible and may be curved or folded to achieve one or more specific characteristics or attributes, for example, to permit manufacture of a compact, foldable system and/or to achieve a specific light-distribution pattern. In some embodiments of the present invention, the light sheet typically includes or consists essentially of an array of light-emitting elements (LEEs) electrically coupled by conductive elements formed on a flexible substrate, for example as described in U.S. patent application Ser. No. 13/799,807, filed Mar. 13, 2013 (the '807 application), or U.S. patent application Ser. No. 13/970,027, filed Aug. 19, 2013 (the '027 application), the entire disclosure of each of which is herein hereby incorporated by reference.

Figure 1A:
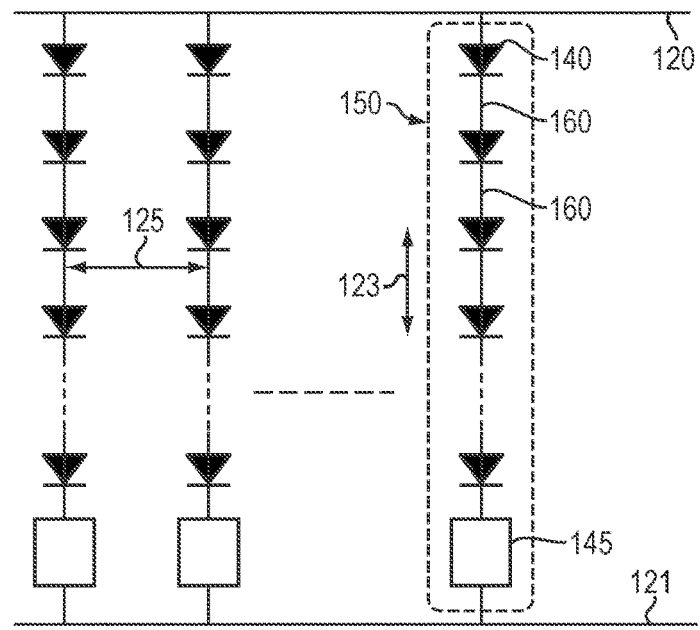
FIG. 1A is a circuit diagram of a portion of a light sheet in accordance with various embodiments of the invention.

FIG. 1A depicts an exemplary circuit topology of one embodiment of a light sheet, in accordance with embodiments of the present invention, which features conductive elements 160, at least two power conductors 120, 121, multiple LEEs 140, and control elements (CEs) 145. In some embodiments, LEEs 140 may be configured in a regular periodic array, for example a substantially square or rectangular array, where LEEs 140 are separated by pitch (or "spacing") 123 in one direction (for example, a vertical or intrastring direction) and by pitch 125 in a substantially orthogonal direction (for example, a horizontal or interstring direction). In some embodiments, pitch 125 is the same as or substantially the same as pitch 123. While the geometrical layout and pitches 123, 125 are described in connection with the circuit schematic shown in FIG. 1A, such geometry, layout, and pitches are not limitations of the present invention, and in other embodiments the physical layout of the circuit elements may be different than the circuit topology shown in FIG. 1A. Additionally, other embodiments may have different circuit topologies, for example LEEs 140 may be electrically coupled in parallel, in a combination of series and parallel, or any other arrangement. In some embodiments, more than one group of electrically connected LEEs 140 may be electrically coupled to one CE 145, while other embodiments may not require any CEs 145. The specific circuit topology is not a limitation of the present invention.

FIG. 1A shows two power conductors 120, 121, which may be used to provide power to strings 150 of LEEs 140. Each string 150 may include two or more electrically coupled LEEs 140. LEEs 140 in string 150 may be electrically coupled in series, as shown in FIG. 1A; however, this is not a limitation of the present invention, and in other embodiments other examples of electrical coupling may be utilized, for example parallel connections or any combination of series and parallel connections. FIG. 1A shows CE 145 connected in series with LEEs 140 of string 150: however, this is not a limitation of the present invention, and in other embodiments CE 145 may have different electrical coupling between power conductors 120, 121, or may be absent altogether. For example, in some embodiments CE 145 may be separately electrically coupled to power conductors 120, 121 and to the LEE string 150, while in other embodiments each CE 145 may be electrically coupled to two or more strings. The number of strings electrically coupled to each CE 145 is not a limitation of the present invention. Combinations of structures described herein, as well as other electrical connections, all fall within the scope of the present invention. Power conductors 120, 121 may be used to provide power to strings 150, for example AC power, DC power, or power modulated by any other means.

Figure 1B:
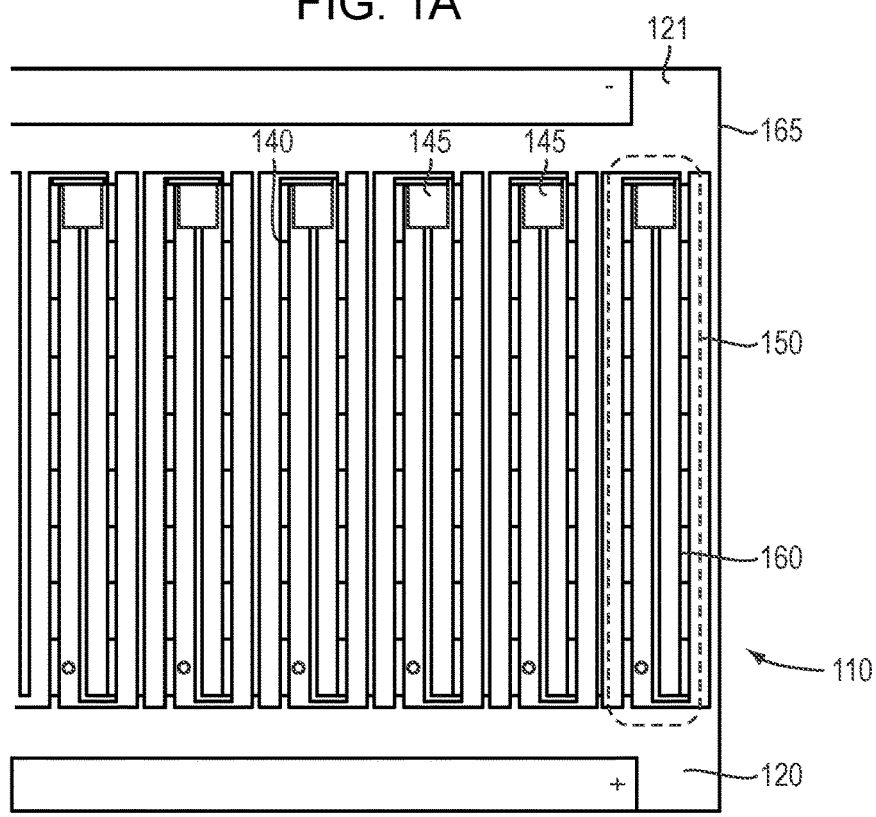
FIGS. 1B and 1C are schematic plan views of light sheets in accordance with various embodiments of the invention.
Figure 1C:
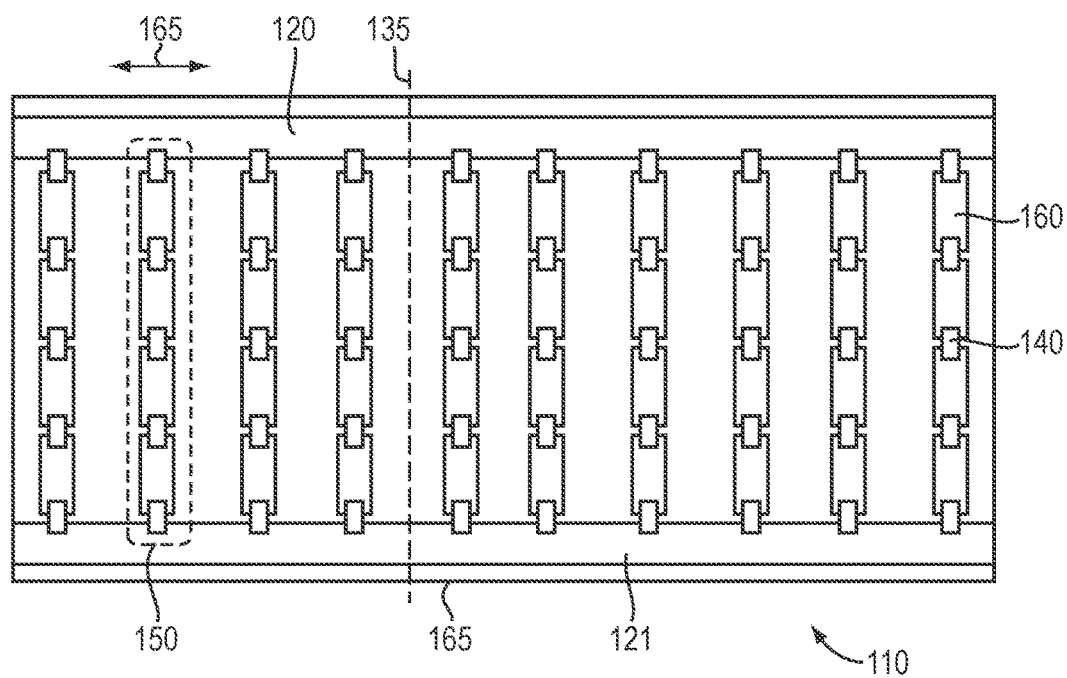

Referring to FIGS. 1B and 1C that depict schematics of exemplary light sheets 110, a light sheet 110 may feature an array of LEEs 140 each electrically coupled between conductive traces 160, as well as power conductors 120, 121 providing power to conductive traces 160 and CEs 145, all of which are disposed over a substrate 165. As utilized herein, a "wiring board" refers to a substrate for LEEs with or without additional elements such as conductive traces or CEs. A wiring board may also be referred to as a light sheet or a circuit board. FIG. 1B shows a portion of a light sheet 110. In the exemplary embodiment depicted in FIG. 1B, power conductors 120, 121 are spaced apart from each other and light-emitting strings (or simply "strings") 150 are connected in parallel across power conductors 120, 121. In some embodiments, for example as shown in FIG. 1B, strings 150 do not cross (i.e., intersect) each other. In other words, power conductors 120, 121 are oriented in one direction and strings 150 are oriented such that they span power conductors 120, 121 in a different direction. As shown in FIG. 1B, strings 150 are substantially perpendicular to power conductors 120, 121. However, this is not a limitation of the present invention, and in other embodiments at least some segments (i.e., portions connecting two or more LEEs 140), or even the entire strings 150, may define a line (not necessarily a straight line) that is not perpendicular to power conductors 120, 121 yet is (at least for an entire string 150) not parallel to power conductors 120, 121. In other embodiments, strings 150 may intersect, for example one string 150 splitting into two or more strings 150, or two or more strings 150 joining to form a reduced number of strings 150. In some embodiments, conductive elements 160 may cross over each other without being electrically coupled to each other (i.e., they may be electrically insulated from each other), and in some embodiments strings 150 may cross over or under each other without being electrically coupled to each other. In some embodiments, all or a portion of one or more strings 150 may extend outside of the area bound by power conductors 120, 121. Various examples of string geometries and conformations utilized in embodiments of the present invention are described in the '807 and '027 applications.

As shown in FIGS. 1B and 1C, LEEs 140 may be positioned across substrate 165 in a regular periodic array, although this is not a limitation of the present invention, and in other embodiments LEEs 140 may occupy any positions on light sheet 110. Power conductors 120, 121 provide power to each LEE string, for example the string 150 encircled by the dashed line in FIG. 1B. Each LEE string 150 typically includes multiple conductive traces 160 that interconnect multiple LEEs 140, as well as one or more CEs 145, which in FIG. 1B is in series with LEEs 140. String 150 shown in FIG. 1B is a folded string, i.e., a string that has three segments electrically coupled in series but positioned as three adjacent segments. A string segment is a portion of a string spanning all or a portion of the region between power conductors 120, 121 in FIG. 1B. In light sheet 110, some string segments may include LEEs 140 while others do not. However, in other embodiments the distribution and position of LEEs 140 along conductive elements 160 and string segments may be different. In some embodiments, a string 150 may be a straight string, i.e., a string with no folds, as shown in FIG. 1C. (For simplicity, the example shown in FIG. 1C does not depict CEs 145.) One end of string 150 is electrically coupled to power conductor 120, while the other end of string 150 is electrically coupled to power conductor 121. As will be discussed, the number of segments in a string 150 is not a limitation of the present invention. Various examples of straight and folded strings utilized in embodiments of the present invention are detailed in the '807 and '027 applications.

FIGS. 1A and 1B illustrate three aspects in accordance with embodiments of the present invention. The first is the multiple strings 150 that are powered by the set of power conductors 120, 121. The second is the positional relationship between the locations of LEEs 140 and CE 145, which is disposed between the conductive traces 160 and between power conductors 120,121, such that the pitch between LEEs 140 is not disrupted by the placement or position of CE 145. The third is the inclusion of a CE 145 in each string of series-connected LEEs 140. Combinations of these three aspects enable light sheet 110 to be economically manufactured in very long lengths, for example in a roll-to-roll process, and cut to specified lengths, forming light sheets, while maintaining the ability to tile, or place light sheets adjacent to each other (e.g., in the length direction), with no or substantially no change in pitch between LEEs 140 or in the optical characteristics across the joint between two adjacent light sheets, as discussed in more detail in the '807 and '027 applications.

In an exemplary embodiment, CE 145 is configured to maintain a constant or substantially constant current through LEEs 140 of string 150. For example, in some embodiments, a constant voltage may be applied to power conductors 120, 121, which may, under certain circumstances may have some variation, or the sum of the forward voltages of LEEs 140 in different strings may be somewhat different, for example as a result of manufacturing tolerances, or the component and/or operational values of the element(s) within CE 145 may vary, for example as a result of manufacturing tolerances or changes in operating temperature, and CE 145 acts to maintain the current through LEEs 140 substantially constant in the face of these variations. In other words, in some embodiments the input to the light sheet is a constant voltage that is applied to power conductors 120, 121, and CEs 145 convert the constant voltage to a constant or substantially constant current through LEEs 140. The design of CE 145 may be varied to provide different levels of control or variation of the current through LEEs 140. In some embodiments, CEs 145 may control the current through LEEs 140 to be substantially constant with a variation of less than about ±25%. In some embodiments, CEs 145 may control the current through LEEs 140 to be substantially constant with a variation of less than about ±15%. In some embodiments, CEs 145 may control the current through LEEs 140 to be substantially constant with a variation of less than about ±10%. In some embodiments, CEs 145 may control the current through LEES 140 to be substantially constant with a variation of less than about ±5%.

In some embodiments. CEs 145 may, in response to a control signal, act to maintain a constant or substantially constant current through LEEs 140 until instructed to change to a different constant or substantially constant current, for example by an external control signal. In some embodiments, as detailed herein, all CEs 145 on a sheet may act in concert, that is maintain or change the current through all associated LEEs 140; however, this is not a limitation of the present invention, and in other embodiments one or more CEs 145 may be individually instructed and/or energized.

In some embodiments LEEs 140 may include or consist essentially of light-emitting diodes (LEDs) or lasers. In some embodiments, light emitted from light sheet 110 is in the form of an array of bright spots, or light-emission points, resulting in a pixelated pattern. However, this is not a limitation of the present invention, and in other embodiments light sheet 110 includes different types of light emitters, for example organic LEDs (OLEDs). In some embodiments, light sheet 110 may emit light homogeneously or substantially homogeneously, for example light sheet 110 may include an array of LEEs 140 behind an optic or diffuser that spreads the light from LEEs 140 homogeneously or substantially homogeneously. In some embodiments, light sheet 110 may include one or more OLEDs emitting homogeneously or substantially homogeneously over light sheet 110.

In the embodiment depicted in FIG. 1B, LEEs 140 are distributed substantially uniformly over light sheet 110; however, this is not a limitation of the present invention, and in other embodiments. LEEs 140 may have a non-uniform distribution. As will be understood, the distributions of LEE 140 on light sheet 110 shown in FIGS. 1B and 1C are not limitations of the present invention, and other embodiments may have other distributions of LEEs 140. In some embodiments, one or more portions of light sheet 110 may be unpopulated with LEEs 140. In some embodiments, the distribution of LEEs 140 on light sheet 110 is specifically chosen to achieve one or more characteristics, for example optical, electrical, thermal or the like, as described herein. In some embodiments, the distribution of LEEs 140 on light sheet 110 may be chosen to create a certain decorative look.

In some embodiments, light sheet 110 may also be cut to length, as discussed in more detail in the '807 and '027 applications. For example, in some embodiments of the present invention light sheet 110 may be cut between strings 150.

In some embodiments, light sheet 110 does not require any additional thermal management or heat-sinking, i.e., the heat generated by LEEs 140 is at least partially accommodated by the structure of light sheet 110 itself, for example substrate 165 and/or conductive elements 160 and/or power conductors 120, 121.

In some embodiments of the present invention, substrate 165 is substantially covered with an array of LEEs 140 interconnected by conductive elements 160; however, in some embodiments one or more portions of substrate 165 may not be populated with LEEs 140.

In some embodiments, all LEEs 140 in the lighting system may be driven at the same or substantially the same current; however, this is not a limitation of the present invention, and in other embodiments different LEEs 140 or different groups of LEEs 140 may be driven at different currents.

In some embodiments, all LEEs 140 in the lighting system may have the same optical characteristics, for example luminous or radiant flux, CCT, CRI, R9, spectral power distribution, light distribution pattern, angular color uniformity, or the like; however, this is not a limitation of the present invention, and in other embodiments different LEEs 140 or different groups of LEEs 140 may have different optical characteristics.

Figure 2A:
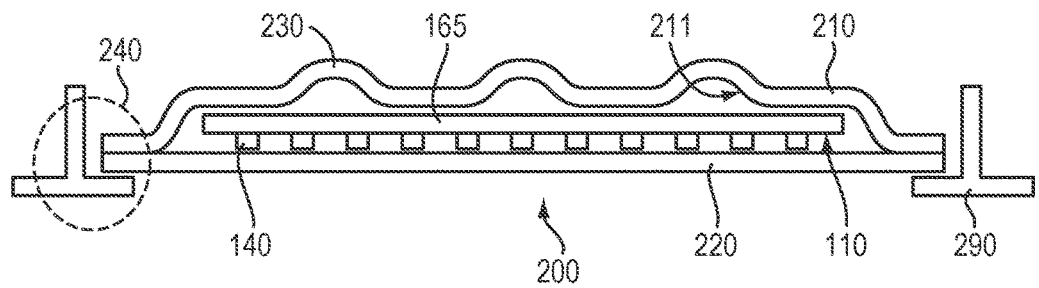
FIGS. 2A and 2B are schematic cross-sections of lighting devices in accordance with various embodiments of the invention.

FIGS. 2A-2F depict exemplary lighting devices in accordance with embodiments of the present invention, although alternative devices systems with similar functionality are also within the scope of the invention. FIG. 2A shows a cross-sectional view of a lighting device 200 of the present invention. (Conductive traces 160 are not shown in FIGS. 2A-2F for clarity.) Lighting device 200 as shown is designed to be installed into a ceiling grid system, for example a T-grid 290, as shown in FIG. 2A; however; this is not a limitation of the present invention; and in other embodiments other grid systems may be used. In other embodiments, lighting device 200 may be mounted using other techniques, for example it may be surface mounted or suspended. Lighting device 200 includes a top housing 210, a bottom housing 220, and light sheet 110 that includes substrate 165 and LEEs 140, as detailed above. As used herein, the term "housing" broadly connotes any containment structure or medium for fully overlying a top or bottom surface of the light sheet 110. A housing may be rigid or flexible, polymeric or other material (e.g., glass), and may interconnect with or be bondable to the light sheet or to another housing over the opposite surface of the light sheet to form a seal, e.g., a water-tight or water-resistant seal, around at least a portion of the light sheet. In some embodiments of the present invention, top housing 210 and bottom housing 220 are fabricated from plastic, for example polyester, acrylic, polystyrene, polyethylene, polyimide, polyethylene naphthalate (PEN), polyethylene terephthalate (PET), polypropylene, polycarbonate, acrylonitrile butadiene styrene (ABS), or the like. In some embodiments of the present invention top housing 210 and bottom housing 220 are fabricated by molding or thermoforming.

In some embodiments of the present invention, the materials of construction, for example substrate 165, top housing 210 and/or bottom housing 220, include or consist essentially of materials having low flammability. One measure of flammability is defined by Underwriter Laboratories (UL) standard 94. UL94 includes various rating levels, for example UL94 V-1, UL94 V-2, UL94 V-0, UL94 V5B, UL94 V5A, and the like. In some embodiments of the present invention, the materials of construction are chosen to provide a certain level of flame retardance to the lighting system, for example, as measured by the UL94 flammability standard. In some embodiments of the present invention, the lighting system, for example as shown in FIG. 2A, 2C-2F, 3A-3E, 6B-6D and the like, the lighting system has a UL94 rating of at least UL94 V-1, or at least UL94 V-0, or at least UL94 5B, or at least UL94 5A.

In preferable embodiments of the present invention, all or a portion of bottom housing 220 is transparent to a wavelength of light emitted by LEEs 140, for example having a transmittance to a wavelength of light emitted by LEEs 140 of at least 75%, or at least 85%, or at least 95%. In some embodiments of the present invention, all or a portion of bottom housing 220 may include a diffuser, for example to diffuse or scatter a wavelength of light emitted by LEEs 140.

In some embodiments of the present invention, all or a portion of top housing 210 is transparent to a wavelength of light emitted by LEES 140, for example having a transmittance to a wavelength of light emitted by LEES 140 of at least 75%, or at least 85%, or at least 95%, while in other embodiments all or a portion of top housing 210 may be translucent or opaque to a wavelength of light emitted by LEEs 140. In some embodiments of the present invention, all or a portion of housing 210 or an inner surface 211 of top housing 210 may be reflective to a wavelength of light emitted by LEEs 140, for example having a reflectance to a wavelength of light emitted by LEEs 140 of at least 75%, or at least 85%, or at least 95%.

In some embodiments, portions of top housing 210 and/or bottom housing 220 may be ribbed (i.e., have protruding segments), e.g., have one or more ribs 230 in FIG. 2A, or otherwise structured to provide rigidity to lighting device 200.

In some embodiments of the present invention, top housing 210 and bottom housing 220 may be joined at the periphery of lighting device 200, for example in the region identified as 240 in FIG. 2A. In some embodiments of the present invention, top housing 210 and bottom housing 220 may be joined by heat welding, high-frequency welding, ultrasonic welding, laser welding, adhesive, glue, tape, or the like. In some embodiments of the present invention, top housing 210 and/or bottom housing 220 may be joined to light sheet 110 or to each other within the periphery of lighting device 200.

In some embodiments of the present invention, housings 210, 220 may be configured to protect light sheet 110, for example to provide mechanical protection, protection from dust, water, etc. One method for rating different levels of environmental protection is an IP rating as specified by International Protection Marking in International Electrotechnical Commission (IEC) standard 60529, providing classification of degrees of protection provided by enclosures for electrical equipment, the entirety of which is hereby incorporated by reference herein. In some embodiments of the present invention, lighting device 200 may have any IP rating, for example from IP00 to IP 69k, or any other IP rating. In some embodiments of the present invention, lighting device 200 has an IP 44 rating, or an IP65 rating or an IP66 rating or an IP67 rating or an IP68 rating. In general for an IP XY rating, "X" indicates the level of protection for access to electrical parts and ingress to solid foreign objects, while "Y" indicates the level of protection for ingress of harmful water. For example, an IP44 rating provides access and ingress protection for objects greater than about 1 mm and protection from water splashing on the system. In another example, an IP66 rating provides a dust-tight enclosure and protection from water jets incident on the system. Specific details of the requirements and test method are detailed within the IP specification.

In some embodiments of the present invention, the interior region formed by housings 210, 220 may additionally contain a desiccant to absorb excess moisture and/or water vapor and prevent degradation or corrosion of light sheet 110 and associated components. In some embodiments of the present invention, the interior region formed by housings 210, 220 may be purged with an inert gas, for example nitrogen or argon, prior to sealing to reduce the moisture and/or water vapor concentration and prevent degradation or corrosion of light sheet 110 and associated components.

In some embodiments of the present invention, the interior region formed by housings 210, 220 may be evacuated to a relatively low pressure, or may be filled with air. In some embodiments of the present invention, all or portions of the interior region formed by housings 210, 220 may be filled with a material that is transparent or substantially transparent to a wavelength of light emitted by LEEs 140. In one embodiment of the present invention, the transparent material includes or consists essentially of silicone, polyurethane, epoxy, or other suitable materials. Examples of such transparent materials include materials from the ASP series of silicone phenyls manufactured by Shin Etsu, or the Sylgard series manufactured by Dow Corning. In some embodiments of the present invention, the transparent material may reduce total-internal-reflection (TIR) losses of LEEs 140 and may provide enhanced optical coupling between LEEs 140 and bottom housing 220. In some embodiments of the present invention, the transparent material has an index of refraction greater than about 1.4, or greater than about 1.45.

In some embodiments of the present invention, a flexible membrane or diaphragm may be disposed within a portion of a housing or substrate 165 to accommodate expansion and contraction of the atmosphere within the sealed region that may occur during storage and/or operation, for example as a result of changes in temperature or altitude. In some embodiments of the present invention, all or a portion of a housing or substrate 165 has sufficient flexibility to accommodate such expansions and contractions of the atmosphere within the sealed region.

Figure 2B:
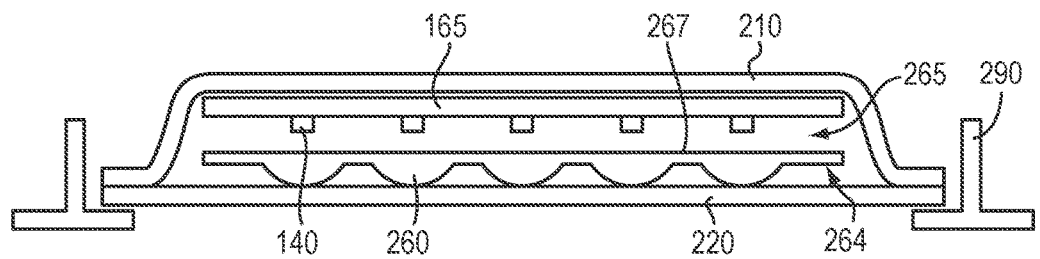
Figure 2C:
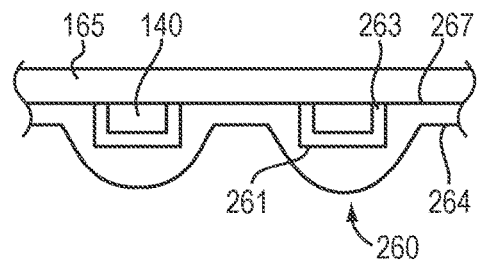
FIG. 2C is a schematic cross-section of a portion of a lighting device in accordance with various embodiments of the invention.

In some embodiments of the present invention, lighting device 200 may additionally include one or more optical elements to control one or more optical characteristics, for example luminous or radiant flux, CCT, CRI, R9, spectral power distribution, light-distribution pattern, angular color uniformity, or the like. In some embodiments, the optical elements may include an optic substrate 264 having multiple optical elements 260 on one side of optic substrate 264 and a second side (or "face") 267 opposite the first side that is substantially flat and positioned in contact or spaced apart from LEEs 140, as shown in FIG. 2B; however, this is not a limitation of the present invention, and in other embodiments rear face 267 may be shaped or patterned. For example, in some embodiments of the present invention, rear face 267 of optic substrate 264 may include indentations 261 into which fit one or more LEEs 140, for example as shown in detail in FIG. 2C.

Optical elements 260 associated with optic substrate 264 may all be the same or may be different from each other. Optical elements 260 may include or consist essentially of, e.g., a refractive optic, a diffractive optic, a TIR optic, a Fresnel optic, or the like, or combinations of different types of optical elements. Optical elements 260 may be shaped or engineered to achieve a specific light-distribution pattern from the array of light emitters, phosphors and optical elements.

Optic substrate 264 typically features an array of optical elements 260; in some embodiments, one optical element 260 is associated with each LEE 140, while in other embodiments multiple LEEs 140 are associated with one optical element 260, or multiple optical elements 260 are associated with a single LEE 140, or no engineered optical element is associated with any LEEs 140, for example portions of optic substrate 264 thereover may merely be flat or roughened surfaces. In one embodiment, the optical elements 260 scatter, diffuse, and/or spread out light generated by LEEs 140.

FIG. 2B shows the axis of each optical element 260 as substantially aligned with the center of an LEE 140; however, this is not a limitation of the present invention, and in other embodiments optical element 260 may be shifted in one or more lateral directions with respect to an LEE 140, as detailed in U.S. Pat. No. 8,746,923, filed Dec. 4, 2012, the entire disclosure of which is incorporated by reference. It should be noted that alignment, as used herein, may mean that the center of one structure, for example an LEE 140, is aligned with the center of another structure, for example an optical element 260; however, this is not a limitation of the present invention, and in other embodiments alignment refers to a specified relationship between the geometries of multiple structures.

Optical substrate 264 may be substantially optically transparent or translucent. For example, optical substrate 264 may exhibit a transmittance or reflectance greater than about 70% for optical wavelengths ranging between about 400 nm and about 700 nm. Optical substrate 264 may include or consist essentially of a material that is transparent to a wavelength of light emitted by LEEs 140, for example having a transmittance greater than about 75%, or greater than about 85% or greater than about 95% to a wavelength of light emitted by LEE 140. Optical substrate 264 may be substantially flexible or rigid. Optical elements 260 may be formed in or on optical substrate 264. For example, optical elements 260 may be formed by etching, polishing, grinding, machining, molding, embossing, extruding, casting, or the like. The method of formation of optical elements 260 is not a limitation of embodiments of the present invention.

Optic substrate 264 may include or consist essentially of, for example, acrylic, polycarbonate, polyethylene naphthalate (PEN), polyethylene terephthalate (PET), polycarbonate, polyethersulfone, polyester, polyimide, polyethylene, glass, or the like. In some embodiments, optic substrate 264 includes or consists essentially of multiple materials and/or layers.

The structure of FIGS. 2A and 2B shows the rear face 267 of optic substrate 264 spaced apart from LEEs 140; however, this is not a limitation of the present invention, and in other embodiments rear face 267 of optic substrate 264 may be in contact with or substantially in contact with LEEs 140. Space 263 (FIG. 2C) and space 265 (FIG. 2B) between LEEs 140 and optic substrate 264 may be evacuated to a relatively low pressure, or may be filled with air or may be filled or partially filled with a material that is transparent or substantially transparent to a wavelength of light emitted by LEEs 140. In one embodiment of the present invention, the transparent material includes or consists essentially of silicone, epoxy or other suitable materials. Examples of such transparent materials include materials from the ASP series of silicone phenyls manufactured by Shin Etsu, or the Sylgard series manufactured by Dow Corning. In some embodiments of the present invention, the transparent material may reduce TIR losses in LEEs 140 and may provide enhanced optical coupling between LEEs 140 and optic substrate 264. In some embodiments of the present invention, the transparent material has an index of refraction greater than about 1.4, or greater than about 1.45.

Substrate 165 may be affixed to optic substrate 264 by the aforementioned transparent material or a similar material and/or by other means, for example adhesive, glue, tape, mechanical fasteners, or the like. In one embodiment of the present invention, double-sided tape, such as 3M 467MP, is used to affix substrate 165 to optic substrate 264. In one embodiment of the present invention, a liquid adhesive, such as Dymax 3099, is used to affix substrate 165 to optic substrate 264.

In some embodiments of the present invention, lighting device 200 may have lateral dimensions to fit or drop into standard-dimension grid ceilings. For example, in North America some grid ceilings have grid dimensions of about 2 feet by about 2 feet, or about 2 feet by about 4 feet. In some embodiments of the present invention, lighting device 200 may have a height in the range of about 50 mm to about 150 mm. In some embodiments of the present invention, lighting device 100 may have a relatively light weight, for example when housings 210, 220 include or consist essentially of ABS, lighting device 200 may have a weight per area of less than about 5 kg/m$^2$, or less than about 3 kg/m$^2$ or less than about 1.5 kg/m$^2$. In some embodiments of the present invention, lighting device 200 having dimensions of about 60 cm by about 60 cm may weigh less than about 1 kg, or less than about 0.7 kg. In some embodiments of the present invention, lighting device 200 having dimensions of about 60 cm by about 120 cm may weigh less than about 2 kg, or less than about 1.4 kg. It should be noted that the weights described herein do not include a driver that drives LEEs 140. In some embodiments of the present invention, lighting device 200 may have a thickness less than about 70 mm or less than about 50 mm or less than about 30 mm, or less than about 15 mm or less than about 10 mm, or less than about 5 mm, or less than about 3 mm.

Relatively lightweight lighting devices have several advantages. First, they reduce the weight load on the building, potentially permitting a reduction in new construction costs. Second, they are easier to handle and install. In some embodiments of the present invention, a lightweight lighting device may be installed, either temporarily or permanently, using hook-and-loop fasteners, adhesive, tape, dry wall hangers, nails, screws, or the like. Third, shipping costs typically depend on size and weight. The reduced weight of lighting devices of embodiments of the present invention may thus reduce shipping costs. The relatively thin profile of lighting devices of embodiments of the present invention permits increased shipping density, for example more lighting devices per shipping box or pallet, also resulting in lower shipping and storage costs. In some embodiments, lighting devices or ribbed lighting devices of embodiments of the present invention may be designed to stack relatively tightly, with little need for additional space or packing material for protection.

Figure 2D:
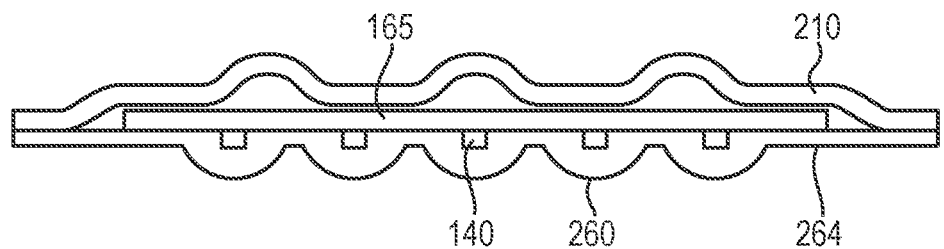
FIGS. 2D-2F are schematic cross-sections of lighting devices in accordance with various embodiments of the invention.
Figure 2E:
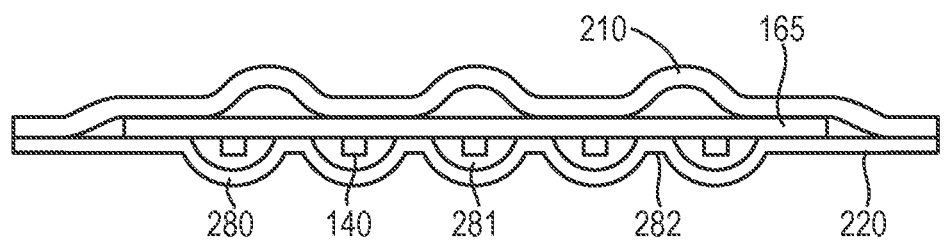

In some embodiments, bottom housing 220 may be eliminated and its function replaced by optic substrate 264, as shown in FIG. 2D. In some embodiments of the present invention, optical substrate 264 may be eliminated and its function replaced by a shaped bottom housing 220. FIG. 2E shows one example of an embodiment of the present invention in which bottom housing 220 is shaped to have optical element shells 280, which in some embodiments correspond functionally to optical elements 260 in FIG. 2B. In this embodiment, region 281 between LEEs 140 and bottom housing 220 is preferably filled or substantially filled with a material transparent to a wavelength of light emitted by LEEs 140, as described herein.

In some embodiments of the present invention bottom housing 220, including optical shell elements 280, may be manufactured using a thermoforming operation. Thermoforming or similar techniques permit rapid, low cost, accurate formation of shaped plastic components, resulting in a relatively low cost for lighting devices such as lighting device 200.

In some embodiments of the present invention, the thickness of top housing 210 may be in the range of about 0.1 mm to about 5 mm, or in the range of about 0.3 mm to about 2.5 mm. In some embodiments of the present invention, the thickness of housings 210, 220 are substantially the same; however, in other embodiments, different portions of housings 210, 220 may have different thicknesses. In one embodiment of the present invention, the thickness of bottom housing 220 in the region between optical shell elements 280, identified as 282 in FIG. 2E, may be thinner than that of bottom housing 220 in shell elements 280, permitting flexing or bending of optic substrate 264 between optical shell elements 280. In this embodiment, a lighting device may itself have a degree of flexibility, permitting curving or bending of the entire lighting device, as shown in FIG. 2F.

Figure 2F:
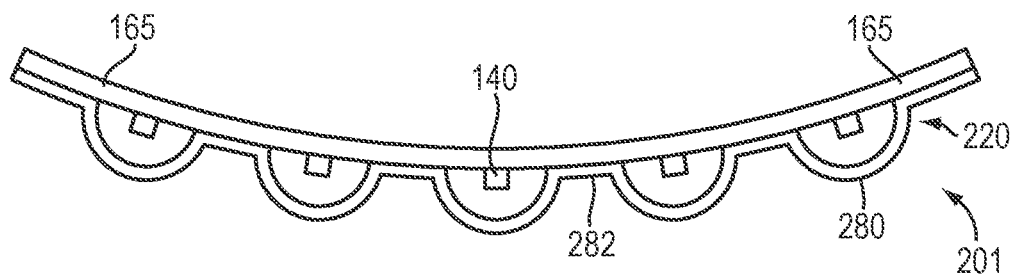

Lighting device 201, shown in FIG. 2F, includes substrate 165 on which are formed LEEs 140 and that is mated to bottom housing 220. In this embodiment of the present invention, top housing 210 is not utilized; however, this is not a limitation of the present invention, and in other embodiments top housing 210 may be included in the structure of lighting device 201. While this example incorporates bottom housing 210 having variable thickness, this is not a limitation of the present invention, and in other embodiments bottom housing 220 may have a substantially uniform thickness. While the structure of FIG. 2F has been described as flexible, this is not a limitation of the present invention, and in other embodiments the structure of FIG. 2F may be rigid or substantially rigid.

In another embodiment of the present invention, a portion of the housing acts as a reflector for light emitted by LEEs 140. Lighting device 300 of FIG. 3A includes LEEs 140 formed on substrate 165 which is mated to a housing 310. As shown, housing 310 incorporates domes 320 or portions of the housing 310 have been shaped into domes 320. (Conductive traces 160 are not shown in FIG. 3A for clarity.) In some embodiments of the present invention, the material of domes 320 and/or housing 310 are reflective to a wavelength of light emitted by LEEs 140, while in other embodiments all or a portion of housing 310 is coated with one or more coatings that are reflective of a wavelength of light emitted by LEEs 140, for example having a reflectance greater than about 75%, or about 85%, or about 95% to a wavelength of light emitted by LEEs 140. For example, in one embodiment of the present invention, the interior surface of dome 320 is coated with a reflective coating. In some embodiments of the present invention, the reflective coating includes or consists essentially of aluminum, copper, silver, gold, chromium, or the like. In some embodiments of the present invention, the reflective coating includes or consists essentially of a reflective metal covered by one or more dielectric layers. In some embodiments of the present invention, the reflective coating is a dielectric mirror.

Figure 3A:
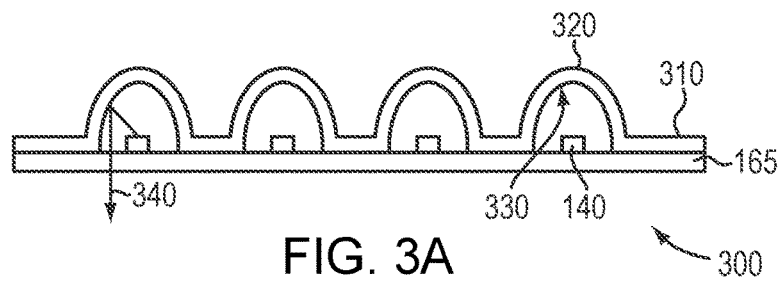
FIGS. 3A and 3B are a schematic cross-section (FIG. 3A) and a partial schematic plan view (FIG. 3B) of a lighting device in accordance with various embodiments of the invention.
Figure 3B:
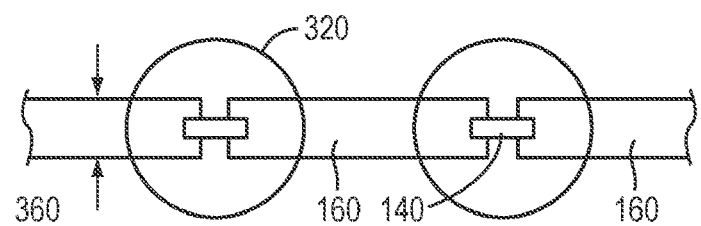

In these embodiments, substrate 165 is preferably transparent to a wavelength of light emitted by LEEs 140, for example having a transmittance of at least 75% or at least 85%, or at least 95%. FIG. 3B shows a plan view of a portion of lighting device 300 of FIG. 3A and shows conductive traces 160 that cover a portion of substrate 165 under dome 320. In some embodiments, conductive traces 160 are relatively thin, for example having a width 360 less than about 1 mm or less than about 0.5 mm or less than about 0.25 mm. In some embodiments, width 360 is different (e.g., less) for portions of conductive traces 160 disposed under dome 320, than it is outside of dome 320. In some embodiments, the area of substrate 165 under dome 320 that is covered by conductive traces 160 is less than 35% of total substrate 165 area under dome 320, or less than 25% of total substrate 165 area under dome 320, or less than 15% of total substrate 165 area under dome 320, or less than 5% of total substrate 165 area under dome 320, so as to minimize light loss as light from LEE 140 is transmitted through substrate 165. In some embodiments, conductive traces 160 may include or consist essentially of a transparent conductor, for example indium tin oxide (ITO), or other transparent conductive oxides (TCOs).

In some embodiments of the present invention, the shape of domes 320 may be engineered to produce different light-distribution patterns. For example, in one embodiment of the present invention, dome 320 has a substantially paraboloid shape and LEE 140 is mounted substantially at the focal point of the paraboloid, resulting in a relatively collimated beam 340 emitted from lighting device 300. In another embodiment of the present invention, dome 320 may have a hemispherical shape, or may be a portion of a hemisphere or paraboloid or may have any other shape. In some embodiments, the region inside dome 320 may be evacuated, or filled with air, or filled or partially filled with a material transparent to a wavelength of light emitted by LEEs 140, as described herein.

Figure 3C:
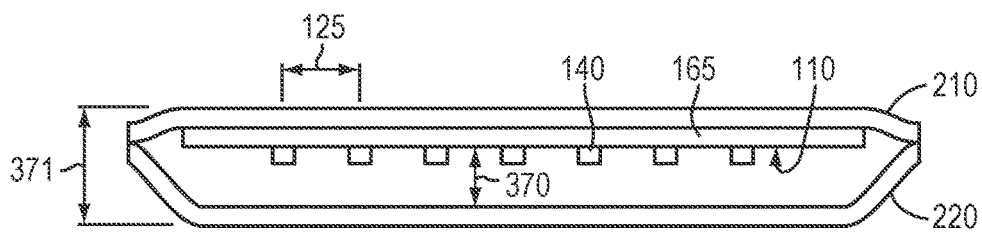
FIGS. 3C-3E are schematic cross-sections of lighting devices in accordance with various embodiments of the invention.
Figure 3D:
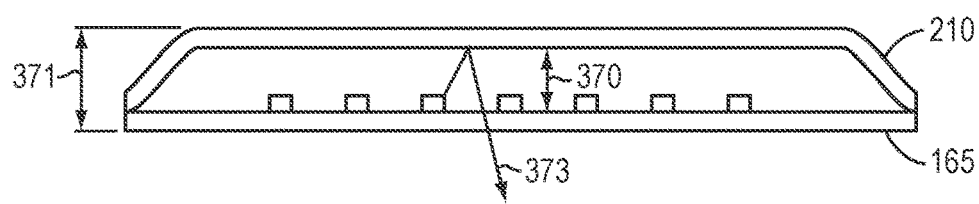

In another embodiment of the present invention, the housing element facing LEEs 140 may be spaced apart from LEEs 140, for example as shown in FIGS. 3C and 3D. In some embodiments of the present invention, as shown in FIG. 3C, all or a portion of bottom housing 220 is transparent to a wavelength of light emitted by LEEs 140. In some embodiments of the present invention, all or a portion of bottom housing 220 is a diffuser and acts to diffuse or homogenize the light emitted by individual LEEs 140, reducing or substantially eliminating pixelization and producing a relatively or substantially homogeneous plane of light, rather than a visible array of individual points of illumination.

In the lighting device of FIG. 3C, bottom housing component 220 is spaced apart from light sheet 110 by a spacing 370. In some embodiments, spacing 370 is about 1× to about 3× a spacing 125 between LEEs 140. In some embodiments, spacing 370 is about 1.3× to about 2× the spacing 125. In some embodiments, a total thickness of 371 of the lighting device is in the range of about 5 mm to about 150 mm, or in the range of about 20 mm to about 100 mm.

In some embodiments of the present invention, as shown in FIG. 3D, all or a portion of top housing 210 or a coating on the interior surface of top housing 210 is reflective to a wavelength of light emitted by LEEs 140, and all or a portion of substrate 165 is transparent to a wavelength of light emitted by LEEs 140. Light 373 emitted by LEEs 140 is directed towards and reflected from top housing 210 and exits the lighting device through light sheet 110. In some embodiments of the present invention, a bottom housing may be incorporated below substrate 165 (i.e., opposite top housing 210).

In some embodiments of the present invention, all or a portion of bottom housing 220 is a diffuser and acts to diffuse or homogenize the light emitted by individual LEEs 140, reducing or substantially eliminating pixelization and producing a relatively or substantially homogeneous plane of light. In some embodiments of the present invention, top housing 210 or a coating on the interior of top housing 210 may be a specular reflector, while in other embodiments it may be a diffuse reflector. For example, in one embodiment of the present invention, top housing 210 and/or a coating on all or a portion of the interior surface of top housing 210 may be a diffuse reflector and have a reflectance greater than about 90%, and substrate 165 may be transparent to a wavelength of light emitted by LEEs 140. In some embodiments, the spectral reflectance characteristics of top housing 210 or a coating on all or a portion of the interior surface of top housing 210 may be engineered to preferentially reflect or absorb one or more portions of the spectral power distribution from LEEs 140, resulting in the ability to modify one or more spectral characteristics of the lighting device, for example CCT or CRI.

Figure 3E:
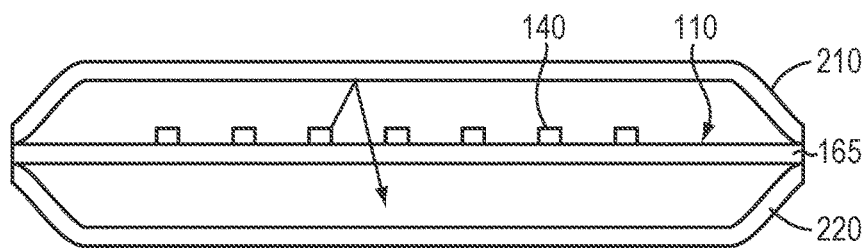

In some embodiments of the present invention, all or portions of the structures of FIGS. 3C and 3D may be combined to produce lighting devices similar to that shown in FIG. 3E. FIG. 3E shows a lighting device in accordance with embodiments of the present invention, including top housing 210 and bottom housing 220, both of which are spaced apart from light sheet 110. As discussed herein, all or a portion of top housing 210 may act as a specular or diffuse reflector, while all or a portion of bottom housing 220 may be transparent or a diffuser. In this lighting device, light emitted from LEEs 140 is directed substantially towards top housing 210, from which it is reflected and exits the lighting device after transmitting through light sheet 110 and bottom housing 220. As discussed herein, this structure reduces or substantially eliminates pixelization and results in a relatively or substantially homogeneous plane of light.

In some embodiments of the present invention, top housing 210 may permit transmission of a portion of light emitted by LEEs 140 to provide illumination in both upward and downward directions. For example, in one embodiment of the present invention, the lighting device may provide both direct and indirect illumination. In some embodiments of the present invention, top housing 210 may include or consist essentially of one or more portions having a relatively high reflectance to a wavelength of light emitted by LEEs 140 and one or more portions having a relatively high transmittance to a wavelength of light emitted by LEEs 140. In one embodiment of the present invention, top housing 210 may have substantially uniform optical characteristics, for example having a transmittance to a wavelength of light emitted by LEEs 140 in the range of about 20% to about 70% and a reflectance to a wavelength of light emitted by LEEs 140 in the range of about 20% to about 70%, with the constraint that the reflectance and transmittance may not together be greater than 100%.

Figure 4:
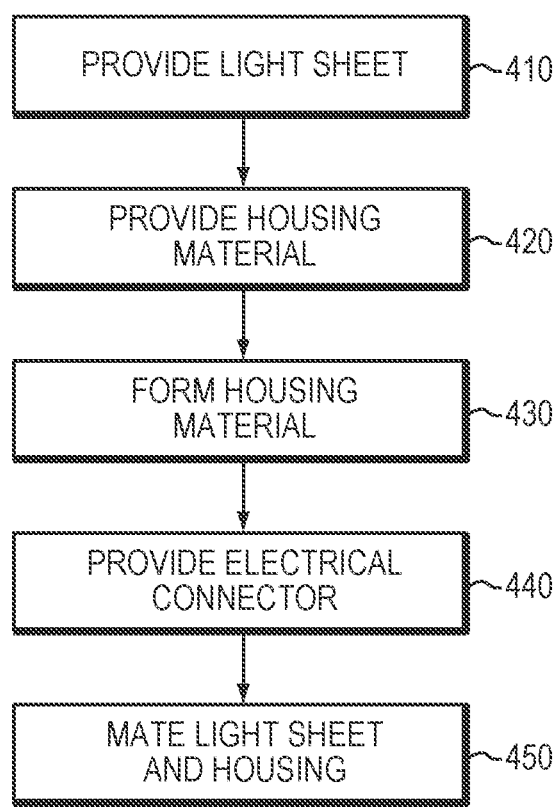
FIG. 4 is a flowchart of a method of fabrication of lighting devices in accordance with various embodiments of the invention.

The structures of FIGS. 2A-2F and 3A-3E may be manufactured in a variety of ways. FIG. 4 shows a flow chart of a process 400 for forming the structures of FIGS. 2A 2F and 3A-3E and similar structures. Process 400 is shown having five steps; however, this is not a limitation of the present invention, and in other embodiments the invention has more or fewer steps and/or the steps may be performed in different order. In step 410, a light sheet is provided. In step 420, housing material is provided, e.g., as a single piece or multiple pieces of material. In step 430, one or more pieces of housing (i.e., housing components) are formed from the housing material. In step 440, an electrical connector is provided. In step 450, the housing component(s) and light sheet are mated to form the lighting device. In some embodiments of the present invention, the electrical connector is mated with the light sheet in step 450; however, this is not a limitation of the present invention, and in other embodiments the electrical connector may be mated with the light sheet in a different step or in a separate step.

Figure 5A:
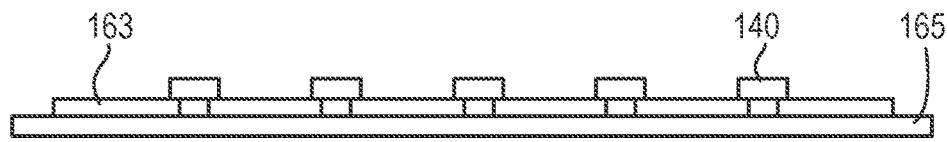
FIG. 5A is a schematic cross-section of a light sheet in accordance with various embodiments of the invention.

FIGS. 5A-5E depict one embodiment of process 400. In this embodiment, a light sheet 110 is provided in step 410, as shown in FIG. 5A. The manufacture of the light sheet 110 includes provision of a substrate 165, forming conductive traces 163 on the substrate 165, attaching and electrically coupling LEEs 140 and optionally other components to the conductive traces 163 and the substrate 165. Additional details may be found herein and in the '807 and '027 applications. However, the specific method of manufacture of light sheet 110 is not a limitation of the present invention, and in other embodiments other methods of manufacture of light sheet 110 may be utilized. For example, in some embodiments light sheet 110 may include or consist essentially of an interconnected array of inorganic LEDs, while in other embodiments light sheet 110 may include one or more organic light emitting diode (OLED) elements.

Figure 5B:
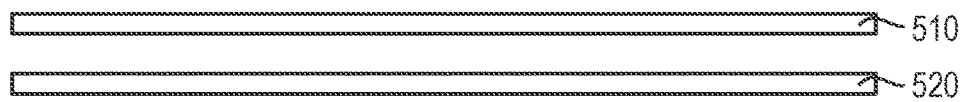
FIGS. 5B and 5C are schematic cross-sections of portions of a lighting-device housing in two stages of manufacture in accordance with various embodiments of the invention.

In step 420 the housing material is provided. Depending on the specific lighting device structure, this may be one piece of housing material or multiple pieces of housing material. In some embodiments, the material for all housing components is the same, while in other embodiments different housing components may include or consist essentially of different materials. For example, for the device described in reference to FIG. 2A, material for the housing components is provided, as shown in FIG. 5B. FIG. 5B shows two types of material 510, 520 that will be used to manufacture top housing 210 and bottom housing 220 respectively. In this example material 520 is clear and has a transmittance to a wavelength of light emitted by LEEs 140 greater than 95%, while material 510 is white and has a reflectance to a wavelength of light emitted by LEEs 140 greater than 95%.

Figure 5C:
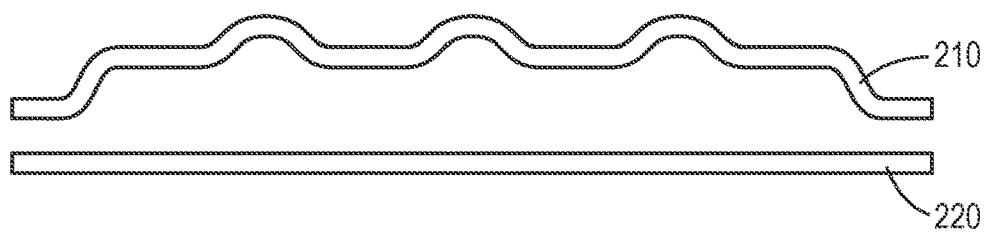

In step 430 the housing components are formed. In some embodiments of the present invention, forming may be cutting to a specific shape, while in other embodiments this may include shaping the material, for example to have a specific three-dimensional shape. In other embodiments of the present invention, step 430 may include applying one or more coatings to the materials provided in step 420. For example, for the device described in reference to FIG. 2A, material 510 is cut to size and ribs are formed therewithin by thermoforming to form top housing 210, while material 520 is cut to size to form bottom housing 220, as shown in FIG. 5C. The method of cutting, shaping, and/or coating of materials is not a limitation of the present invention.

In step 440 one or more electrical connectors to the light sheet are provided. In some embodiments of the present invention, electrical connection includes providing power to light sheet 110, for example to power conductors 120, 121, while in other embodiments communication and/or control signals may also be required to be coupled to light sheet 110. Electrical coupling to the conductive traces or power conductors on light sheet 110 may be accomplished in a variety of ways. In some embodiments of the present invention, electrical coupling to the conductive traces may be accomplished by attaching wires to the appropriate conductive traces. In some embodiments, electrical coupling to the conductive traces may be accomplished by a pressure connection.

Figure 5D:
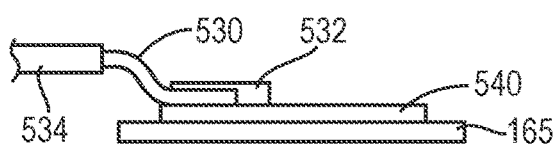
FIGS. 5D-5F are schematic cross-sections of electrical connections to light sheets in accordance with various embodiments of the invention.
Figure 5E:
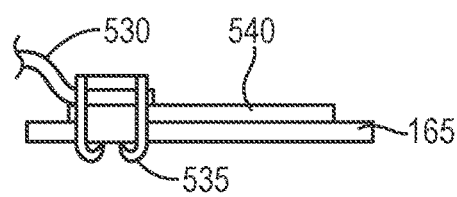

In some embodiments of the present invention, electrical coupling to the conductive traces may be accomplished by attaching one or more wires 530 directly to a conductive element 540 (here conductive element refers to any conductive trace or power conductor on substrate 165), with solder or conductive adhesive or anisotropic conductive adhesive (ACA) 532, as shown in FIG. 5D. FIG. 5D shows wire 530 having optional insulation 534. In some embodiments of the present invention, electrical coupling to the conductive traces may be accomplished by attaching one or more wires 530 to conductive element 540 by crimping, for example crimp 535 shown in FIG. 5E. Various crimp components may be used for this purpose, for example Autosplice TC series or Nicomatic Crimplex series crimp connectors; however, this is not a limitation of the present invention, and in other embodiments other crimp elements may be used.

Figure 5F:
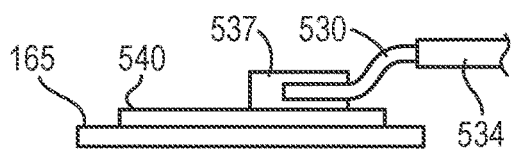

In some embodiments of the present invention, electrical coupling to the conductive traces may be accomplished by attaching one or more connectors to the conductive traces, for example a Wago 2061 series connector or a Molex Lite-Trap series connector; however, this is not a limitation of the present invention, and in other embodiments other connectors may be used. FIG. 5F shows an example of a connector 537 electrically coupled to conductive element 540, for example using solder or conductive adhesive, and wire 530 inserted into connector 537. In some embodiments, wire 530 may have a mating plug or component that mates to connector 537 (not shown in FIG. 5F).

Figure 5G:
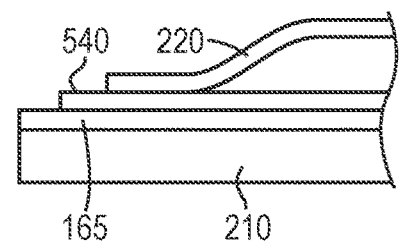
FIG. 5G is a schematic cross-section of a peripheral portion of a lighting device in accordance with various embodiments of the invention.

In some embodiments of the present invention, electrical connection to conductive element 540 may be formed within the housing of the lighting device and the wires attached to the light sheet may extend outside of the housing. In some embodiments of the present invention, a portion of one or more conductive elements may extend beyond a portion of the housing, permitting access and electrical coupling to the conductive traces outside of the housing, for example as shown in FIG. 5G. FIG. 5G shows a portion of substrate 165 and conductive element 540 extending beyond the edge of bottom housing 220, while being supported by top housing 210; however, this is not a limitation of the present invention, and in other embodiments substrate 165 and conductive element 540 may not be supported or fully supported beyond the edge of the housing. In some embodiments of the present invention, one or more wires may be attached to the exposed portion of conductive element 540. In some embodiments, one or more connectors may be formed on the exposed portions of conductive element 540. In some embodiments of the present invention, a portion of conductive element 540 and a portion of underlying substrate 165 may be unsupported, i.e., not backed by a portion of bottom housing 210, and this may be mated with a connector, for example an edge connector or a zero-insertion-force-type connector. In the embodiment of the present invention shown in FIG. 5G, electrical connection to conductive element 540 may be made using any of the methods described herein, for example soldering, conductive adhesive, crimping, ACA, or by other means.

In some embodiments of the present invention, housing 210, 220 may be sealed over substrate 165 and conductive element 540. In some embodiments, wires attached to conductive traces 160 are placed between top housing 210 and bottom housing 220 before sealing, to provide electrical access to light sheet 110. In some embodiments of the present invention, the seal of housing 210, 220 over substrate 165 and conductive element 540 or wire 530/534 may have an IP rating between IP00 and IP69k. In some embodiments of the present invention, the seal of housing 210, 220 over substrate 165 and conductive element 540 or wire 530/534 may have an IP 44 rating, an IP65 rating, an IP66 rating, an IP67 rating, or an IP 68 rating.

Figure 5H:
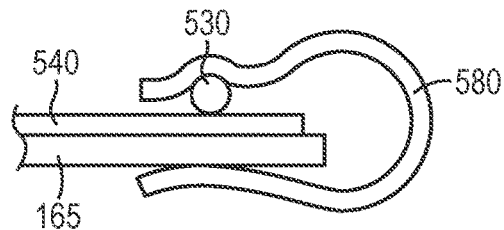
FIGS. 5H-5J are schematic cross-sections of electrical connections to light sheets in accordance with various embodiments of the invention.
Figure 5I:
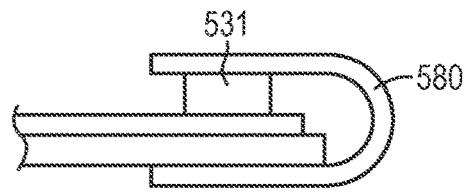
Figure 5J:
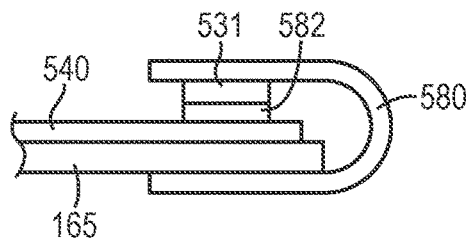

In some embodiments of the present invention, electrical connection to conductive element 540 may be made using a pressure connection, FIGS. 5H and 5I show examples of pressure connections; however, other types of pressure connections may be utilized. FIG. 5H shows clip 580 clamping wire 530 to conductive element 540. In FIG. 5I, wire 530 is replaced by a rectangular or square cross-section conductor 531, which is also held in place with clip 580. In some embodiments of the present invention, clip 580 is spring-loaded, while in other embodiments clip 580 includes a means for applying pressure, for example a tightening screw or the like. In some embodiments of the present invention, a conductive tape or conductive glue or ACA anisotropic conductive film (ACF) 582 may be used to enhance electrical conductivity and robustness of the pressure connection between wire 530 or 531 and conductive element 540, as shown in FIG. 5J. As discussed herein, such connections may be made inside the housing or outside of the housing.

Figure 5K:
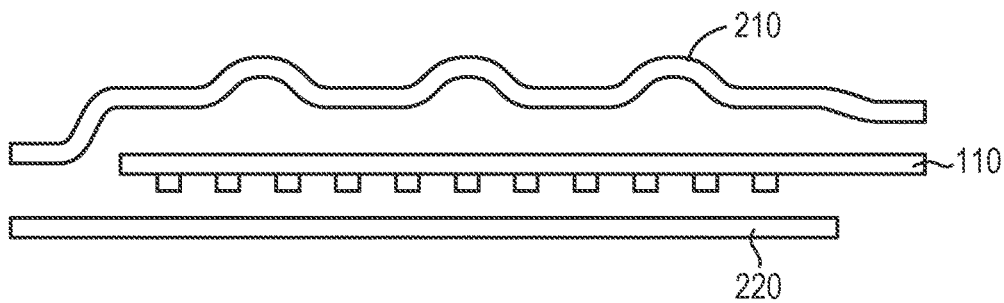
FIGS. 5K and 5L are schematic cross-sections of a lighting device during two stages of manufacture in accordance with various embodiments of the invention.
Figure 5L:
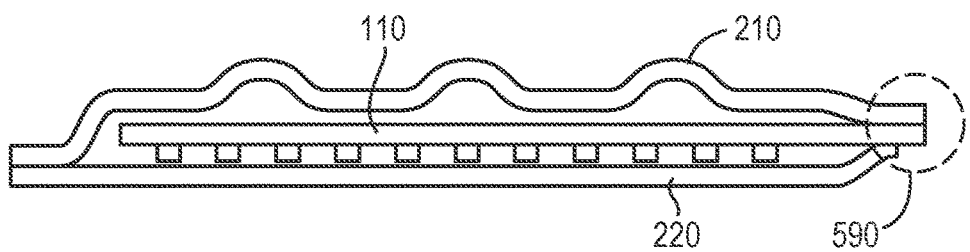

In step 450, the housing elements are mated with the light sheet 110 to form the lighting device. FIG. 5K shows top housing element 210, light sheet 110, and bottom housing element 220 positioned before mating, and FIG. 5L shows the structure of FIG. 5K after mating. Note that in this example, light sheet 110 extends beyond the edge of top housing 210 and electrical connection to conductive element 540 is made after step 450 in region 590, as described herein.

In some embodiments of the present invention, top housing 210 and bottom housing 220 may be joined by heat welding, high-frequency welding, ultrasonic welding, laser welding, adhesive, glue, tape, or the like. In some embodiments of the present invention, light sheet 110 may be adhered to one or more portions of the housing, for example, top housing element 210 or bottom housing element 220, before mating. In some embodiments of the present invention, light sheet 110 may be taped or glued to a portion of the housing before mating.

In some embodiments of the present invention, the interior region formed by housings 210, 220 may be purged and/or filled with an inert gas, for example nitrogen or argon, prior to mating to reduce the moisture and/or water vapor concentration and prevent degradation or corrosion of light sheet 110 and associated components.

In some embodiments of the present invention the interior region formed by housings 210, 220 may be evacuated to a relatively low pressure, or may be filled with air. In some embodiments of the present invention, all or portions of the interior region formed by housings 210, 220 may be filled with a material that is transparent or substantially transparent to a wavelength of light emitted by LEEs 140, as described herein. In some embodiments of the present invention, the transparent material may also form the seal, for example between housing 210, housing 220, and/or light sheet 110.

Figure 6A:
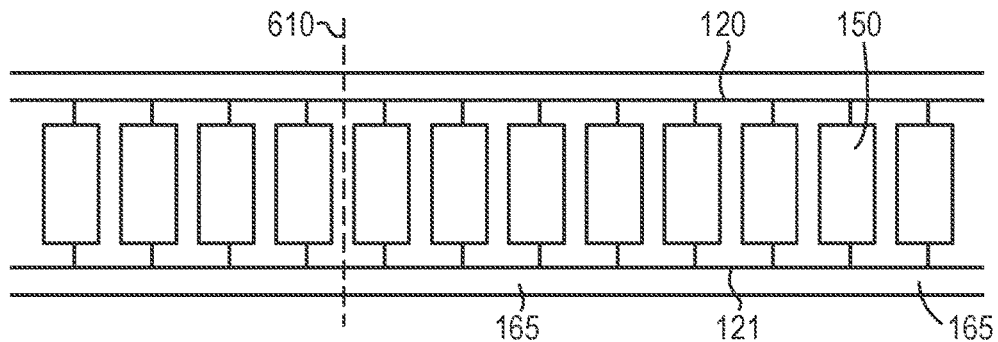
FIG. 6A is a schematic plan view of a sheet separable into multiple lighting devices in accordance with various embodiments of the invention.
Figure 6B:
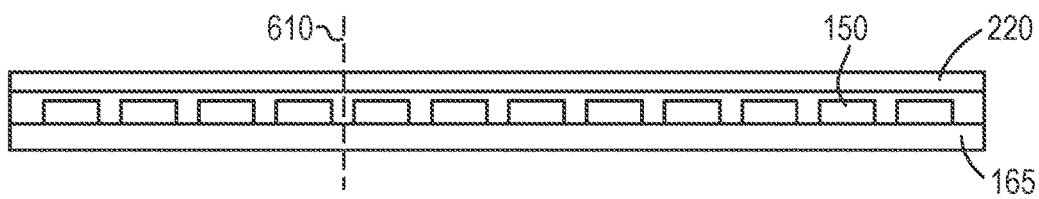
FIGS. 6B-6D are schematic cross-sections of sheets separable into multiple lighting devices in accordance with various embodiments of the invention.
Figure 6C:
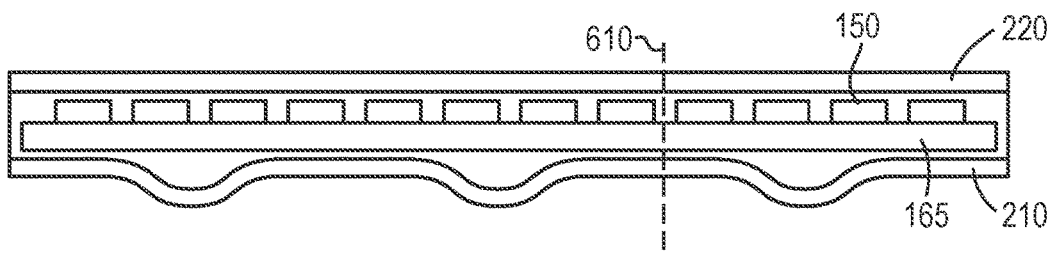
Figure 6D:
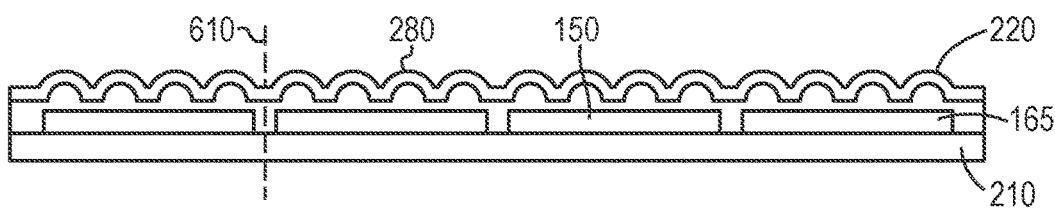

In some embodiments of the present invention, lighting devices may be manufactured in sheets or rolls and cut to length. FIG. 6A shows a plan view and FIGS. 6B-6D show cross-sectional views of lighting devices manufactured according to various embodiments of the present invention. The structure of FIG. 6B is similar to that of FIG. 2F (without the curvature), while the structure of FIG. 6C is similar to that of FIG. 2A, and the structure of FIG. 6D is similar to that of FIG. 2E. Strings 150 are shown in FIGS. 6A-6D without representation of the LEEs and interconnects, for clarity, and as described herein, in some embodiments of the present invention, light sheet 110 may be cut to length between strings 150. FIG. 6A shows a plan view of a length of light sheet 110 including multiple strings 150 and power conductors 120, 121 that may be cut to length between strings 150, for example at a cut line 610. Cut line 610 is also shown for the structures of FIGS. 6B-6D. In one embodiment of the present invention, the required components, for example light sheet 110 and the required housing element or elements, are mated together before cutting. In some embodiments of the present invention, the interior region of the housing is filled with a transparent encapsulant or potting material, which itself provides a seal, for example an IP44, IP65, IP66, IP67, or IP68 rated seal, to the light sheet and housing elements. With such a seal, sheets of lighting devices may be cut to length while still maintaining their protected quality or rating, for example their IP rating.

In some embodiments, lighting devices of the present invention may be manufactured in a roll-to-roll process. FIG. 7A shows one embodiment of the present invention featuring a roll-to-roll process for manufacture of lighting devices; however, this is not a limitation of the present invention, and in other embodiments the process has more or fewer steps and/or the steps may be performed in different order. The exemplary manufacturing process shown in FIG. 7A begins with three material feed streams, although this is not a limitation of the present invention, and in other embodiments fewer or more material feed streams may be utilized. A feed roll 710 supplies material 510 for top housing 210, a feed roll 720 supplies material 520 for bottom housing 220, and a feed roll 730 provides light sheet 110. Material 510 is optionally processed at a processing station 715, for example to cut, shape, or coat material 510, as described herein, for example as described in relation to FIGS. 5A-5L. Material 520 is optionally processed at a processing station 725, for example to cut, shape, or coat material 520, for example as described in reference to FIGS. 5A-5L. Formed material 510' and 520' are brought together with light sheet 110 at a mating point 740 and sealed at a sealing station 750, for example as described in reference to FIGS. 5A-5L, and cut to length at a cutting station 755. Electrical contacts are formed at a wiring station 760. The output of sealing station 750 is an essentially a continuous lighting device 780, including light sheet 110 in a housing. In the cutting station 755, the continuous lighting device 780 is cut into sections 785. In wiring station 760, electrical contact is made to the light sheet, for example by a wire 790 being electrically coupled to the light sheet 110.

Figure 7:
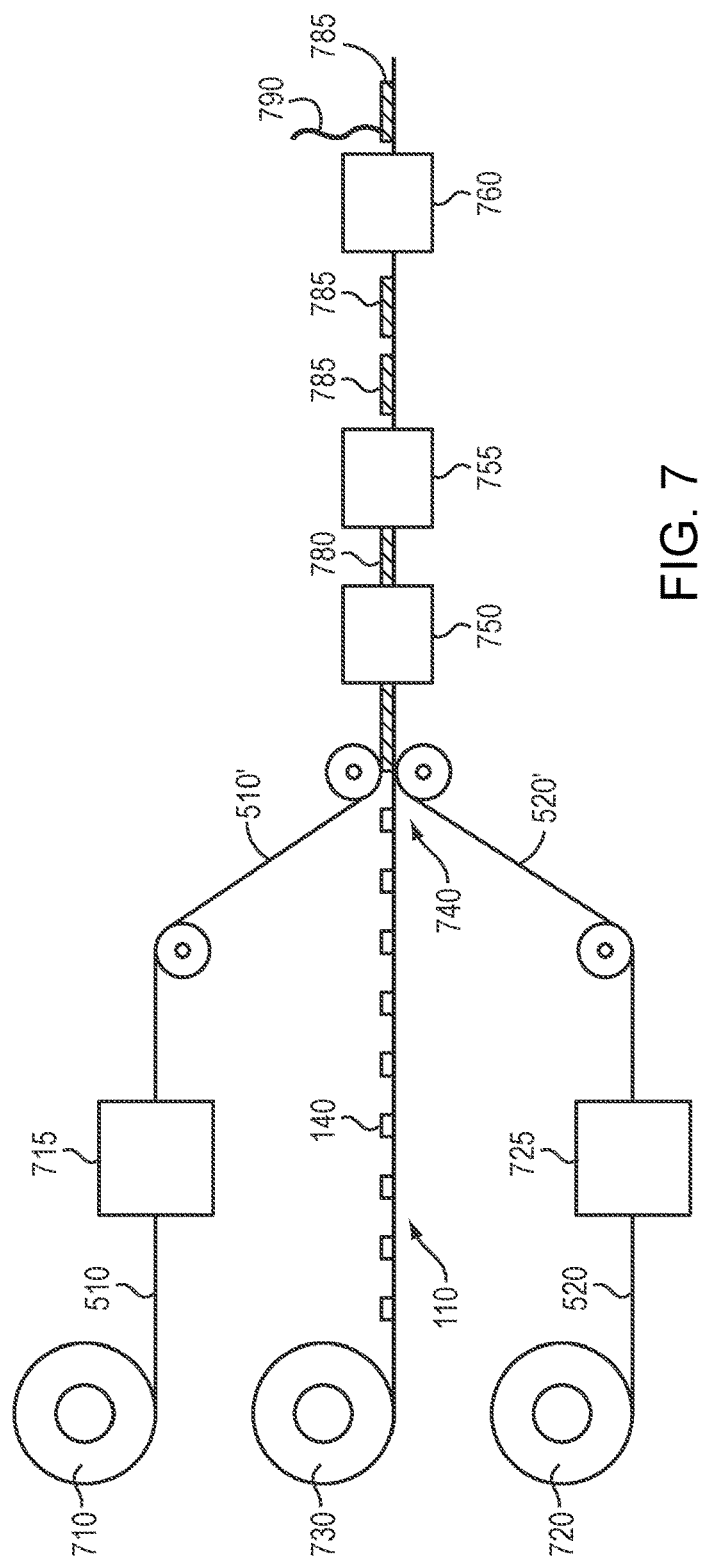
FIGS. 7 and 8 are schematic diagrams of roll-to-roll processing apparatuses for the fabrication of lighting devices in accordance with various embodiments of the invention.
Figure 8:
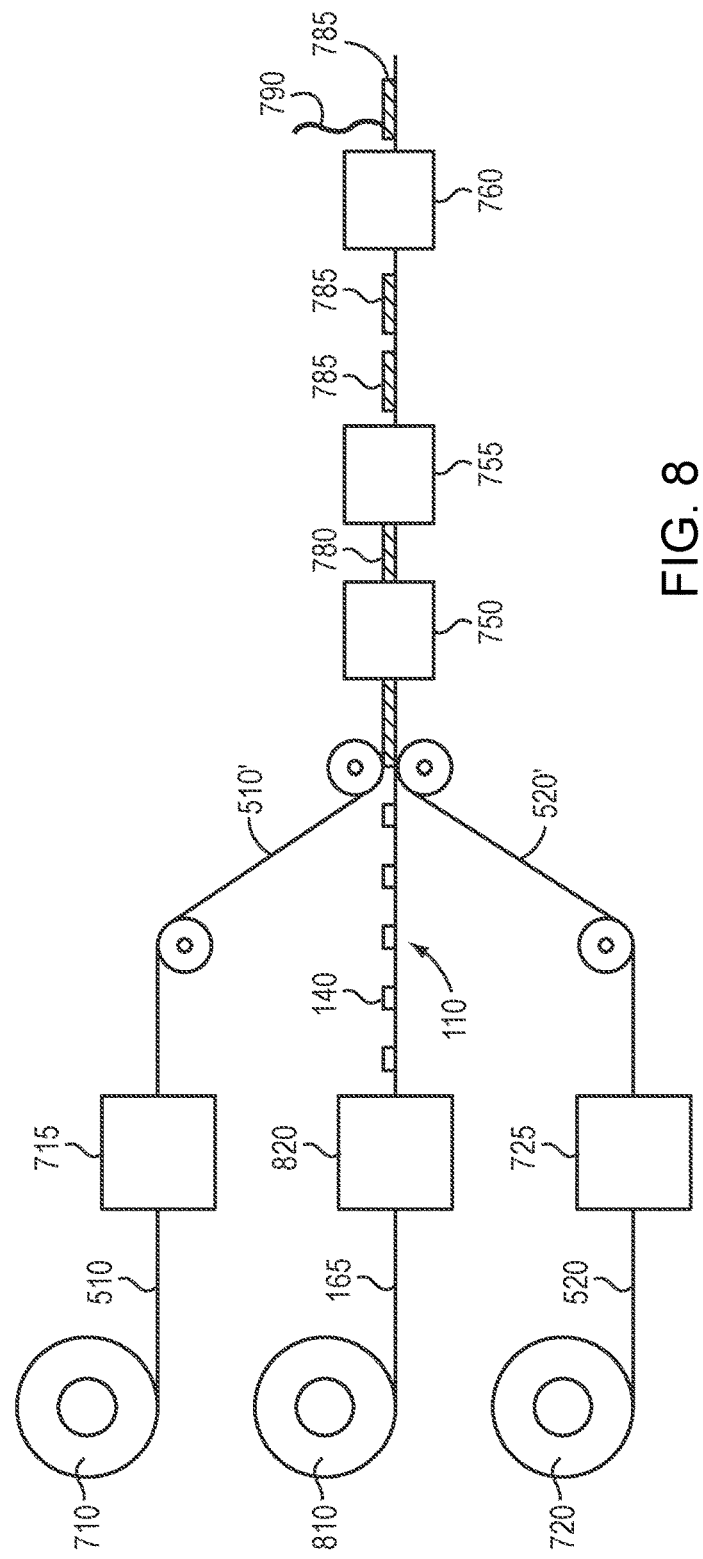

While the process described with respect to FIG. 7 shows completed light sheet 110 as being supplied on a roll, this is not a limitation of the present invention, and in other embodiments lights sheet 110 may itself be manufactured in a roll-to-roll process that feeds into the system of FIG. 7, for example as shown in FIG. 8. In FIG. 8, substrate 165 is supplied on a feed roll 810, and LEEs 140 are mated to substrate 165 at a bonding station 820. Light sheet 110 then feeds into the remainder of the process, as described with reference to FIG. 7. In some embodiments of the present invention, conductive elements 540, for example conductive traces 160 and power conductors 120, 121, are pre-formed on substrate 165 and supplied on feed roll 810. In other embodiments of the present invention, conductive elements 540, for example conductive traces 160 and power conductors 120, 121, are formed in-line on substrate 165, for example before bonding station 820. In some embodiments, conductive elements 540 may be formed using screen printing, or lamination and etching or printing, for example ink jet, gravure printing or the like. The method of forming conductive elements 540 on substrate 165 is not a limitation of the present invention.

While FIGS. 7 and 8 show the roll-to-roll process including a singulation or cutting step, for example at cutting station 755 in FIGS. 7 and 8, this is not a limitation of the present invention, and in other embodiments the singulation step may be removed from the roll-to-roll process, with the completed un-singulated structure being rolled up stored on a take-up roll (not shown in FIGS. 7 and 8).

Figure 9A:
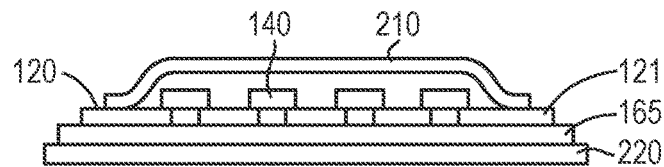
FIG. 9A is a schematic cross-section of a lighting device in accordance with various embodiments of the invention.

In some embodiments, electrical contacts to light sheet 110 may be formed as described in reference to FIG. 5G, where a portion of a conductive element remains outside of the sealed housing. FIG. 9A shows one embodiment of the present invention in cross-section, looking perpendicularly into cut line 610 of FIG. 6B, in which portions of power conductors 120, 121 are not covered by top housing 210, permitting electrical access to power conductors 120, 121 after the housing is formed, for example as described in reference to FIGS. 5H-5J and related text. In other embodiments of the present invention, one or more wires or connectors may be attached to the exposed portions of power conductors 120, 121 before or after the housing is sealed. In some embodiments of the present invention, bottom housing 220 is optional.

Figure 9B:
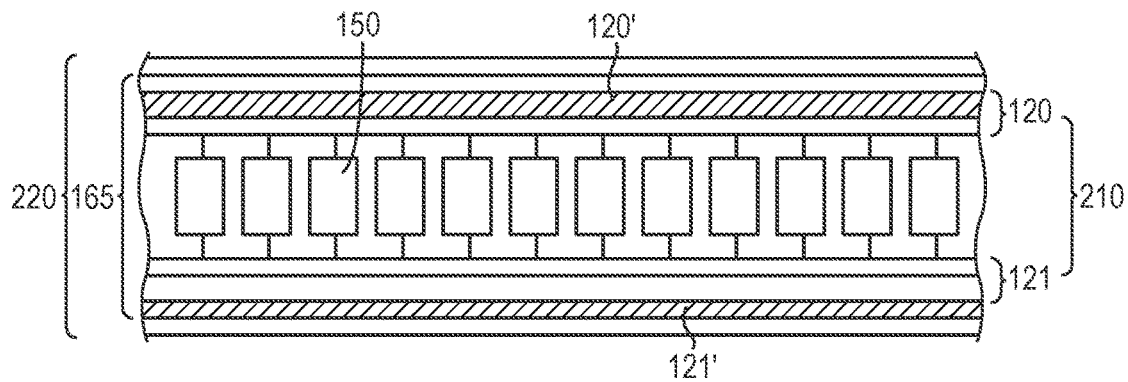
FIGS. 9B and 9C are schematic plan views of sheets separable into multiple lighting devices in accordance with various embodiments of the invention.
Figure 9C:
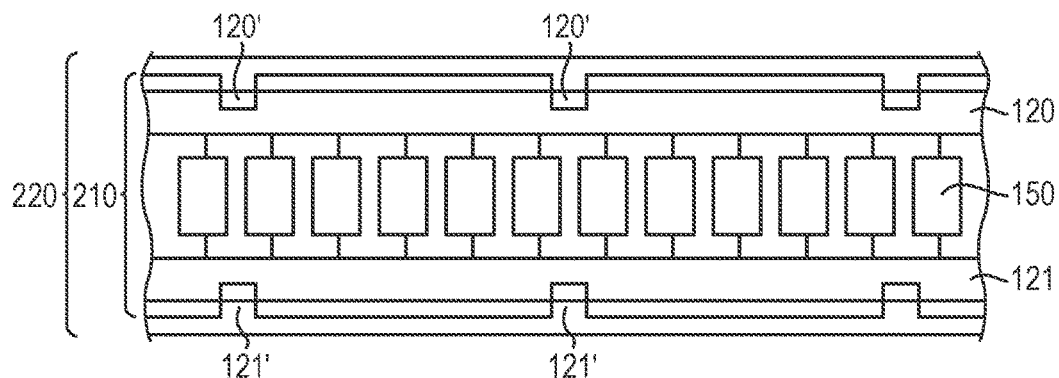

FIG. 9B shows a plan view of the structure of FIG. 9A. The brackets on the identifiers for substrate 165, bottom housing 220, power conductors 120, 121 and top housing 210 indicate the width of these elements. The cross-hatched portion of power conductors 120, 121, identified as 120' and 121' in FIG. 9B, indicate the exposed portions of power conductors 120, 121. In this example, portions of power conductors 120, 121 are fully exposed along the full length of the lighting device; however, this is not a limitation of the present invention, and in other embodiments top housing may cover additional regions of power conductors 120, 121 leaving periodically spaced exposed portions of power conductors 120, 121 as shown in FIG. 9C. FIG. 9C shows a structure similar to that of FIG. 9B; however, in the structure of FIG. 9C only portions of power conductors 120, 121 are exposed periodically, not continuously as in the structure of FIG. 9B. The brackets on the identifiers for bottom housing 220 and top housing 210 indicate the widths of these elements. In FIG. 9C, substrate 165 is not shown for clarity. The exposed portions of power conductors 120, 121 are identified as 120' and 121' in FIG. 9C.

Figure 9D:
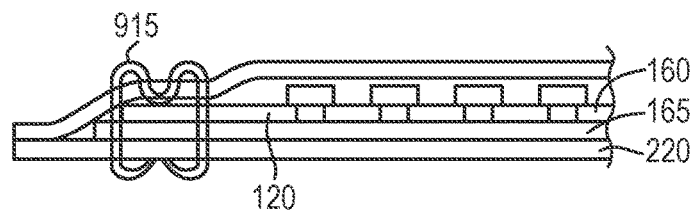
FIG. 9D is a schematic cross-section of a portion of a lighting device having a crimp-type or punch-type electrical connection in accordance with various embodiments of the invention.

In some embodiments of the present invention, electrical contacts may be made by other techniques. For example, in some embodiments, a crimp connection may be made through all or a portion of the housing and a portion of substrate 165 and a portion of a conductive element 540 before or after the housing is sealed. In one embodiment of the present invention, the housing is sealed without exposure of any conductive elements 540 and a crimp-type or punch-type connection 915 is made through the housing, as shown in FIG. 9D. The connection 915 may include or consist essentially of a rivet or staple or other conductor piercing through the housing and electrically contacting and/or piercing power conductor 120 and/or substrate 165.

In some embodiments of the present invention, electrical contacts may be formed before cutting or before sealing and cutting. Cutting is then performed in such a way that each cut light sheet section has the appropriate number and means of electrical connection, for example the appropriate number of wires or connectors. In some embodiments, the seal is performed over the wires.

Figure 9E:
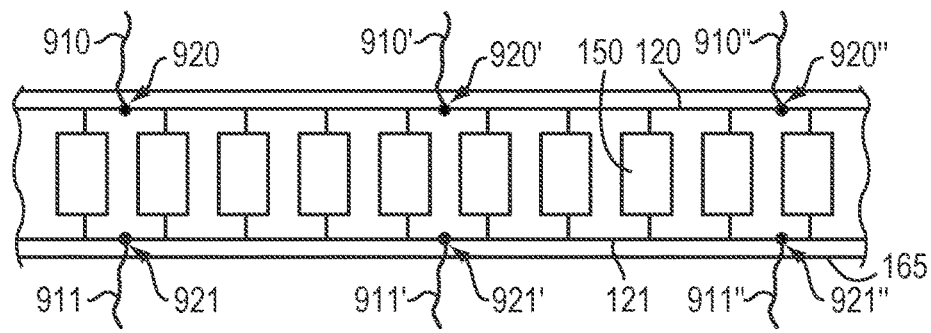
FIGS. 9E and 9F are schematic plan views of a sheet separable (FIG. 9E) and separated (FIG. 9F) into multiple lighting devices in accordance with various embodiments of the invention.

FIG. 9E shows the structure of FIG. 6A at a later stage of manufacture. In FIG. 9E, multiple wires 910, 910', 910", and 911, 911', 911" have been attached to power conductors 120 and 121 respectively, at points 920, 920', 920" and points 921, 921', 921", respectively. In this example, wire attachment points are spaced apart on a power conductor (for example power conductor 120, 121) by about four strings 150.

Figure 9F:
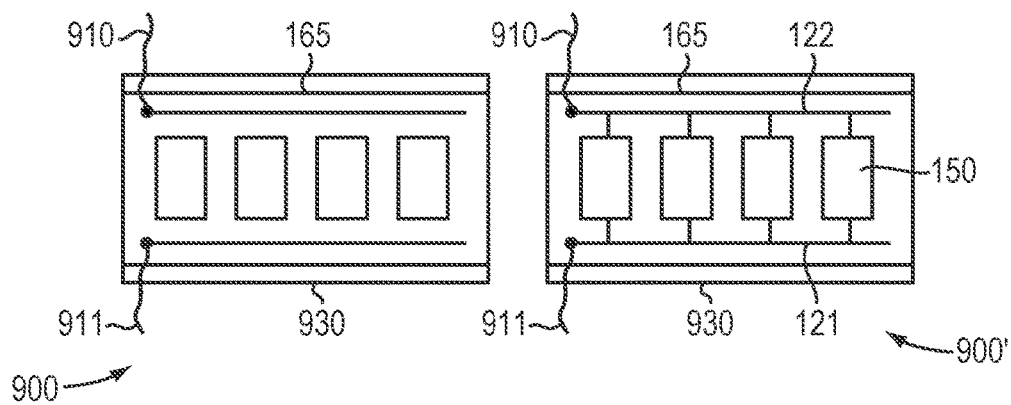

FIG. 9F shows the structure of FIG. 9E at a later stage of manufacture. In FIG. 9F, light sheet 110 has been mated and sealed into housing 930 and cut to lengths corresponding to the spacing of the wire attachment points 920 and 920' and 921 and 921', forming lighting devices 900 and 900', each of which has four strings 150 and wires 910 and 911 and wires 910' and 911' electrically coupled to power conductors 120 and 121 respectively. In FIG. 9F, the portions of the structure of FIG. 9E corresponding to wires 910" and 911" are not shown for clarity.

In some embodiments of the present invention, the electrical connection has the same protection rating, for example IP rating, as the housing, resulting in a system having the desired rating, for example IP 65. IP 66, IP 67, or IP 68.

As discussed herein, other components may be formed on substrate 165 to provide additional functionality to the lighting devices, for example sensors, such as occupancy sensors, light sensors such as light intensity sensors, humidity sensors, fire and/or smoke sensors, communication systems, or the like.

While the process described with respect to FIGS. 9E and 9F results in the manufacture of multiple luminaires having substantially the same size and properties, this is not a limitation of the present invention, and in other embodiments lighting devices having different lengths, or different numbers of strings, may be manufactured on the same production line by varying the spacing between wire attachment and cutting. In some embodiments of the manufacturing process of the present invention, the type of LEEs 140 formed on substrate 165 may vary. For example, a continuous process may be operated in which light sheet 110 having a first type of LEE is manufactured for a given time or length and then the first type of LEE may be replaced with a second type of LEE, without stopping or significantly slowing down the manufacturing operation. In one embodiment of the present invention, this may be accomplished in the system of FIG. 7 by replacing or splicing a second type of light sheet including the second type of LEE onto the material in feel roll 730 or by using a light sheet having different types of LEES formed in different regions. In some embodiments, this may be done without stopping or significantly slowing down the roll-to-roll process. In some embodiments of the present invention, this may be accomplished in the system of FIG. 8 by replacing the first type of LEE with a second type of LEE at bonding station 820 in FIG. 8. For example, different types of LEES may have a different CCT, CRI, luminous flux, R9, angular color uniformity or the like.

In some embodiments of the present invention. CE 145 or one or more components making up CE 145 may be changed in the manufacturing process without stopping or significantly slowing down the roll-to-roll process, in a similar fashion as that described herein for changing the type of LEE. For example, feed roll 730 in FIG. 7 may include light sheet 110 with different portions, each portion having a different CE 145 or one or more different components making up CE 145 or a second light sheet 110 having a different CE 145 or one or more different components making up CE 145 may be spliced onto feed roll 730. In some embodiments of the present invention, CE 145 or the components making up CE 145 may be formed on substrate 165 in bonding station 820 of FIG. 8. In some embodiments of the present invention, the type of CE 145 or one or more components of CE 145 making up CE 145 may be changed during the manufacturing process, without stopping or significantly slowing down the roll-to-roll manufacturing process. In some embodiments of the present invention, the pattern of conductive elements on substrate 165 may be varied during the manufacturing process, for example in the system of FIG. 8, substrate 165 is supplied to bonding station 820 and within bonding station 820, the conductive elements may be formed on substrate 165 as well as LEEs 140 and CEs 145.

Such embodiments of the invention result in the ability to manufacture large volumes of lighting devices in a roll-to-roll process with a standardized product, with a semi-custom product or with a fully customized product. For example, customization may include different LEEs 140 having different properties, different conductive trace patterns, different pitch or patterns between different drive currents for LEEs 140, or different types of material for the housing. For example, housing elements 210, 220 may include or consist essentially of different materials, for example a transparent housing element and a diffusing housing element, or a different thickness material for the housing. Customization may also include options for different substrate materials, for example transparent or opaque to a wavelength of light emitted by LEEs 140, or different thickness substrate, different additional elements such as sensors, communication devices, or the like. In an automated system, in one embodiment of the present invention, the desired quantity and parts are programmed into the system, which then manufactures, in a continuous process, a wide range of differentiated or customized lighting devices having different electrical, optical or physical characteristics.

In another embodiment of the present invention, lighting devices may be manufactured entirely or in part by lamination. For example, the housing may be fabricated by lamination, as when a top housing 210 is formed over LEEs 140 and an optional bottom housing 220 by lamination. In the lamination process, a layer is formed and adhered to light sheet 140 over LEEs 140, providing for example mechanical protection and/or electrical protection (covering conductive traces and other electrically active elements), water and/or moisture protection for example to achieve an IP rating, dust protection, and the like.

In some embodiments, the layer of film to be laminated is adhered to the light sheet using a liquid adhesive that is applied to the light sheet or the film or both before mating, or a dry adhesive that is applied to the film or light sheet or both before mating. In some embodiments, lamination may be performed on a sheet basis, while in other embodiments lamination may be performed using a roll-to-roll process.

FIG. 10A shows one embodiment of the present invention that utilizes a pouch lamination process: however, other embodiments may have more or fewer steps and/or the steps may be performed in a different order. Light sheet 110 is inserted into an opening 1040 of a pouch 1030, which includes a top pouch layer 1010 and a bottom pouch layer 1020. Adhesive is disposed on portions or all of the interior surface of pouch 1030. Pressure and/or heat is then applied to the structure of FIG. 10A, resulting in the laminated structure of FIG. 10B. In another embodiment of the present invention, only a top lamination layer, for example top pouch layer 1010, is used, and substrate 165 forms the back of the laminated structure, as shown in FIG. 10C.

In some embodiments of the present invention, lamination is performed in a roll-to-roll process, for example as shown in FIG. 10D. FIG. 10D shows a feeder roll 1011 for top lamination film 1010, a feeder roll 1021 for optional bottom lamination film 1020, a feeder roll 1015 for light sheet 110, and a lamination stage 1040. Light sheet 110 is mated with top lamination film 1010 and optionally bottom lamination film 1020 at lamination stage 1040, producing the final structure 1050. In some embodiments of the present invention, laminated light sheet 1050 is cut into sheets after lamination stage 1040, while in other embodiments laminated light sheet 1050 is rolled up onto a take-up roll 1070. In some embodiments of the present invention, lamination stage 1040 is a cold lamination process, in which lamination occurs substantially through the application of pressure. In some embodiments of the present invention, lamination stage 1040 is a hot lamination process, in which lamination occurs through the application of both heat and pressure. Some embodiments of the present invention may utilize a lamination tape, which is laminated on light sheet 110 substantially through the application of pressure.

In some embodiments, the lamination film may include or consist essentially of a semicrystalline or amorphous material, e.g., polyethylene naphthalate (PEN), polyethylene terephthalate (PET), polycarbonate, polyethersulfone, polyester, polyimide, polyethylene, or the like. In some embodiments, the lamination film is the same material as substrate 165, while in other embodiments the lamination film is a different material. In preferred embodiments of the present invention, the lamination film is transparent to a wavelength of light emitted by 140, for example having a transmittance greater than about 75% or greater than about 85% or greater than about 95% to such light.

In some embodiments of the present invention, variations in the roll-to-roll lamination manufacturing process may be the same as or similar to those described herein with respect to other roll-to-roll manufacturing processes, for example with reference to FIGS. 8 and 9. In some embodiments of the present invention, methods of making electrical contact to a laminated light sheet may be similar to or the same as described herein with respect to other configurations of the present invention.

In some embodiments of the present invention, the housing may be formed via a coating process. In some embodiments, a coating may be a conformal or substantially conformal coating, while in other embodiments the coating may not be conformal. In some embodiments, a coating may include or consist of one layer, while in other embodiments a coating may include or consist essentially of more than one layer. In some embodiments of the present invention, a multi-layer coating may include or consist essentially of multiple layers of the same material, while in other embodiments a multi-layer coating may include or consist essentially of different materials. In some embodiments of the present invention, multiple layers may be used to ensure integrity of the coating material, for example to reduce the occurrence of or eliminate pinholes or other defects that may compromise the integrity of the coating.

Figure 11A:
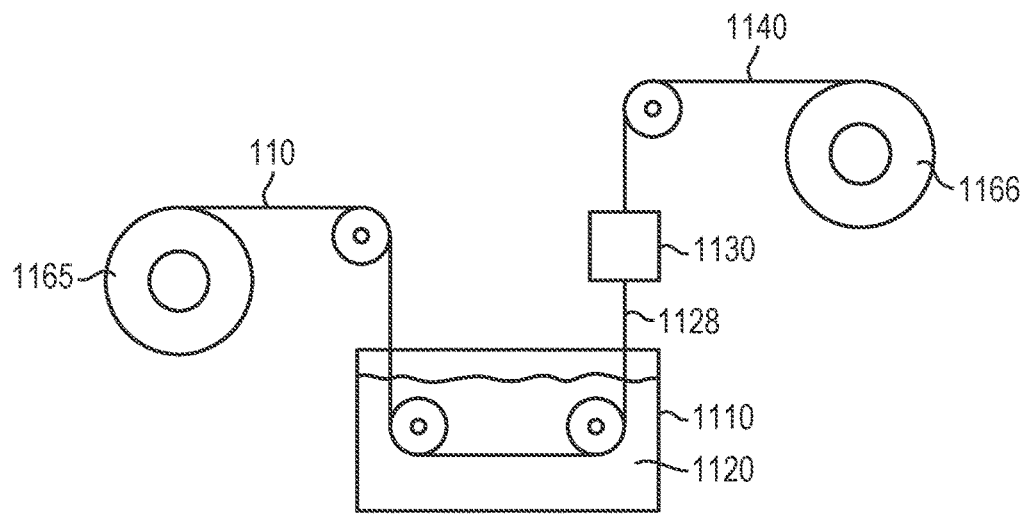
FIG. 11A is a schematic diagram of a roll-to-roll processing apparatus for the fabrication of coated lighting devices in accordance with various embodiments of the invention.

FIG. 11A shows one embodiment of the present invention that utilizes a coating process; however, other embodiments may have more or fewer steps and/or the steps may be performed in a different order. FIG. 11A shows one embodiment of the present invention for manufacture of a coated light sheet; however, in other embodiments, the number of steps in the process may be greater or fewer and the steps may be performed in a different order. In the process of FIG. 11A, light sheet 110 is supplied on a feed roll 1165. Light sheet 110 is passed through a coating bath 1110 containing coating material 1120 (typically in liquid form), resulting in a coated material 1130 that is then cured at a curing stage 1130, resulting in a coated light sheet 1140 that is stored on a take-up roll 1166. In some embodiments, coating stage 1130 includes or consists essentially of a thermal cure; however, this is not a limitation of the present invention, and in other embodiments other curing methods may be used, for example UV cure, radiation cure, room temperature cure, moisture-induced curing, or the like. While FIG. 11A shows a roll-to-roll coating process, this is not a limitation of the present invention, and in other embodiments coating may be performed on a sheet-by-sheet basis. While FIG. 11A shows a dip coating process, this is not a limitation of the present invention, and in other embodiments the coating material may be applied by other techniques, for example spraying, brushing, doctor blade, or printing (e.g., screen, gravure or other printing methods).

Figure 11B:
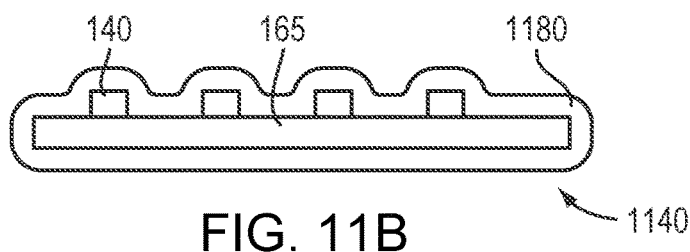
FIGS. 11B-11D are schematic cross-sections of coated lighting devices in accordance with various embodiments of the invention.
Figure 11C:
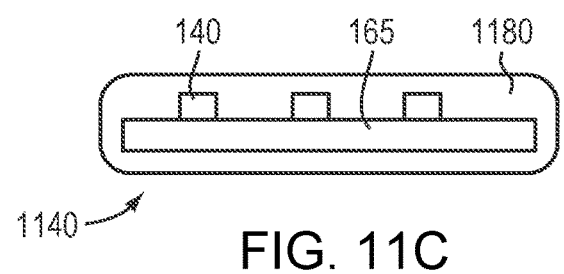
Figure 11D:
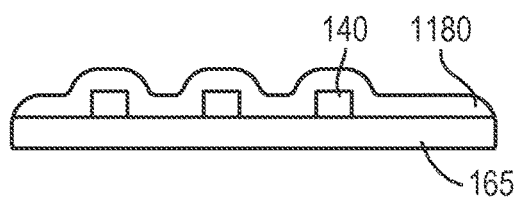

FIG. 11B shows an example of coated light sheet 1140 with a conformal or substantially conformal coating 1180, while FIG. 11C shows an example of coated light sheet 1140 with a non-conformal coating 1180. In some embodiments of the present invention, coating 1180 is applied to the front side of light sheet 110 but not the opposite side of light sheet 110, as shown in FIG. 11D.

In some embodiments of the present invention, variations in the coating manufacturing process may be the same as or similar to those described herein with respect to other roll-to-roll manufacturing processes, for example with reference to FIGS. 8 and 9. In some embodiments of the present invention, methods of making electrical contact to coated light sheet may be the same as or similar to those described herein with respect to other configurations of the present invention.

In some embodiments of the present invention, the housing or coating or lamination material is sealed to light sheet 110, for example to the substrate 165 between LEEs 140, such that cutting light sheet 110 between LEEs 140 retains the integrity of the protection (i.e., does not expose individual LEEs 140 to the outside ambient). For example, in some embodiments of the present invention, the completed structure, including the covering material, for example a housing, a coating, a lamination or the like, may have an IP 44 rating or higher, for example IP65. IP 66. IP67, IP 68 or the like both before and of cutting of the structure between LEEs 140 to form two or more completed structures.

While lighting devices of the present invention have been described with reference to use in grid or T-grid ceiling systems, this is not a limitation of the present invention, and in other embodiments lighting devices of the present invention may be mounted in other configurations, for example flush mounted to a surface such as a ceiling or a wall, suspended from one or more cables, mounted on a pole, or the like.

In some embodiments of the present invention, all or portions of polymeric bottom housing 220 and/or polymeric top housing 210 and/or substrate 165 may have decorations or designs attached to them or printed on them. In some embodiments of the present invention, all or portions of polymeric bottom housing 220 and/or polymeric top housing 210 and/or substrate 165 may be colored.

Figure 12A:
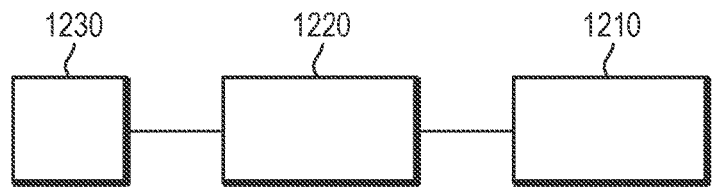
FIGS. 12A-12D are schematic diagrams of electrical connectivity between components of lighting systems in accordance with various embodiments of the invention.

FIG. 12A shows one embodiment of the present invention that features a lighting device 1210 and a driver or power supply 1220. Driver 1220 is powered by, e.g., an AC mains 1230, for example having a voltage of about 120 VAC or a voltage of about 240 VAC or about 277 VAC; however, the value of the voltage and/or its time dependence (i.e., AC or DC or another arbitrary waveform) are not limitations of the present invention. In some embodiments of the present invention, driver 1220 is a substantially constant voltage supply. In some embodiments of the present invention, the output of driver 1220 is pulse-width modulated to enable dimming of LEEs 140. In some embodiments, driver 1220 has a UL class 2 rating, having a voltage output not exceeding 60 V. In some embodiments of the present invention, driver 1220 may include a battery backup system, to provide power to lighting system 1210 in case of a failure of main power 1230.

Figure 12B:
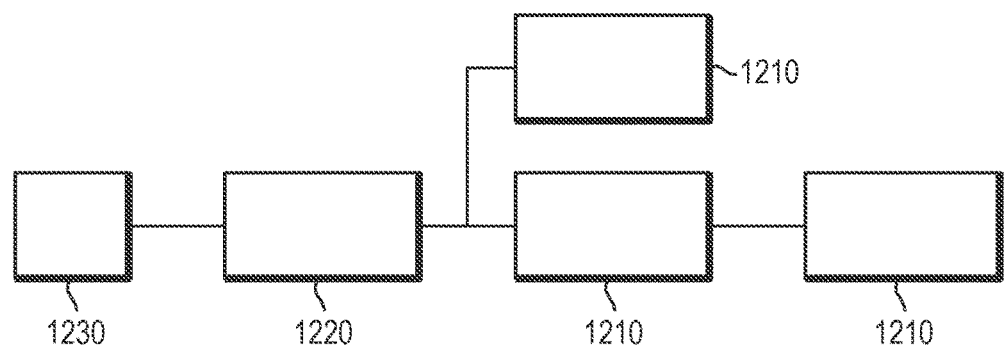
Figure 12C:
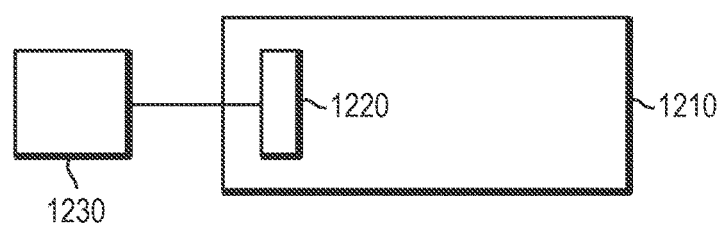

In some embodiments of the present invention, driver 1220 is located outside of lighting device 1210, where, for example, lighting device 1210 is similar to the lighting devices shown in FIGS. 2A, 2B, 2E, 2F, or the like. In some embodiments, one driver 1220 may power one lighting device 1210, as shown in FIG. 12A, while in other embodiments one driver 1220 may power more than one lighting device 1210, as shown in FIG. 12B. FIG. 12B shows one embodiment of the present invention that features three lighting devices 1210, with two connected electrically in series and one connected electrically in parallel to the series-connected lighting device 1210; however, this is not a limitation of the present invention, and in other embodiments all lighting devices may be connected in series, or all lighting devices may be connected in parallel or they may be connected in any other configuration. While FIG. 12B shows three lighting devices 1210, this is not a limitation of the present invention, and in other embodiments fewer or more lighting devices 110 may be utilized. FIG. 12B shows three lighting devices 1210 that are substantially the same; however, this is not a limitation of the present invention, and in other embodiments driver 1220 may provide power to different types of lighting devices 1210, for example having different sizes, different numbers of LEES 140 or different spectral or optical characteristics. In some embodiments, driver 1220 may be incorporated in the housing of the lighting device 1210, as shown in FIG. 12C.

In some embodiments, control and/or communication signals, either to or from the lighting system, or in two-way communication with the lighting system, may also be enabled in embodiments of the present invention. For example, such signals may include a dimming signal, signals providing sensor output (e.g., from a sensor such as a light sensor, occupancy sensor or the like), connection to a lighting control system (e.g., DALI, DMX or the like), or a facilities management system, a safety system, or the like. In some embodiments of the present invention, such sensors may be incorporated within driver 1220, or within lighting device 1210 or on light sheet 110, while in other embodiments such sensors may be incorporated externally to lighting device 1210 and driver 1220.

In some embodiments of the present invention, such signals may provide control information to the lighting system, for example to energize it, to de-energize it, to change the light level (e.g., dimming), to change the CCT, to change the spectral power density, to change the luminous intensity distribution or the like. In some embodiments of the present invention, such signals may provide information about the lighting system, for example a defect or failure in lighting device 1210 and/or driver 1220, the temperature of lighting device 1210 and/or driver 1220, the location of lighting device 1210 and/or driver 1220, the optical characteristics alighting device 1210 or the like.

Figure 12D:
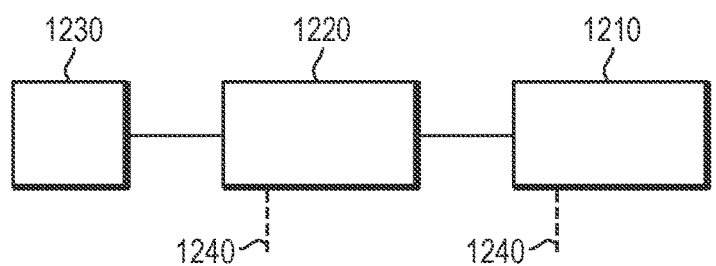

In some embodiments of the present invention, one or more control and/or communication signals may be transmitted to driver 1220, while in other embodiments one or more control and/or communication signals may be transmitted to lighting device 1210, or in other embodiments one or more control and/or communication signals 1240 may be transmitted to both driver 1220 and lighting device 1210, as shown in FIG. 12D. In some embodiments of the present invention, such control and/or communication signals may be transmitted to lighting device 1210 and/or driver 1220 wirelessly, for example using light-based communication such as infra-red (IR) or ultra-violet (UV) or visible light, radio-based communication, for example WIFI, Bluetooth or the like. The method and/or protocol of control and communication signal transmission to driver 1220 and/or lighting device 1210 is not a limitation of the present invention.

In some embodiments, warning or other annunciation signals may be displayed by lighting device 1210. In some embodiments of the present invention, light sheet 110 or portions of light sheet 110 or lighting device 1210 may be energized and de-energized to provide a blinking indication. In some embodiments of the present invention, light sheet 110 may be cut or formed into one or more shapes, symbols or letters, to provide additional information or indications. For example light sheet 110 may be shaped into an arrow, a stop sign, a cross, or other shapes. In some embodiments of the present invention. LEEs 140 on light sheet 110 may be positioned to form one or more shapes, symbols or letters, for example an arrow, a "DO NOT ENTER" sign, a no smoking symbol, a no entry symbol, a symbol for fire, or the like.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

One or more non-LEE devices such as Zener diodes, transient voltage suppressors (TVSs), varistors, etc., may be placed on each light sheet to protect the LEEs 140 from damage that may be caused by high-voltage events, such as electrostatic discharge (ESD) or lightning strikes. In one embodiment, conductive trace segments shown in FIG. 1B or 1C between the LEE strings 150 may be used for placement of a single protection device per light sheet, where the device spans the positive and negative power traces, for example power conductors 120,121. These trace segments also serve to provide a uniform visual pattern of lines in the web direction, which may be more aesthetically pleasing than a light sheet with noticeable gaps between LEE strings 150. In a more general sense, in addition to conductive traces 160 that are part of string 150, additional conductive traces 160 that may or may not be electrically coupled to other strings 150 and/or power conductors 120, 121 may be formed on substrate 165, for example to provide additional power conduction pathways or to achieve a decorative or aesthetically pleasing look to the pattern on the light sheet or to provide a communication pathway to one or more CEs 145, for example to provide a control signal to the one or more CEs 145. These trace segments also serve to provide a uniform visual pattern of lines in the web direction, which may be more aesthetically pleasing than a light sheet with noticeable gaps between LEE strings 150.

In one embodiment, an LEE 140 includes or consists essentially of a bare semiconductor die, while in other embodiments LEE 140 includes or consists essentially of a packaged LED.

In some embodiments, an LEE 140 may include or consist essentially of a "white die" that includes an LED that is integrated with a light-conversion material (e.g., a phosphor) before being attached to the light sheet, as described in U.S. patent application Ser. No. 13/748,864, filed Jan. 24, 2013, or U.S. patent application Ser. No. 13/949,543, filed Jul. 24, 2013, the entire disclosure of each of which is incorporated by reference herein.

In some embodiments. LEEs 140 may emit light in a relatively small wavelength range, for example having a full width at half maximum in the range of about 20 nm to about 200 nm. In some embodiments, all LEEs 140 may emit light of the same or substantially the same wavelength, while in other embodiments different LEEs 140 may emit light of different wavelengths. In some embodiments. LEEs 140 may emit white light, for example that is perceived as white light by the eye. In some embodiments, the white light may be visible light with a spectral power distribution the chromaticity of which is close to the blackbody locus in the CIE 1931 xy or similar color space. In some embodiments, white light has a color temperature in the range of about 2000 K to about 10,000 K. The emission wavelength, full width at half maximum (FWHM) of the emitted light or radiation or other optical characteristics of LEEs 140 may not be all the same and are not a limitation of the present invention.

Advantageously, embodiments of the present invention produce a light sheet 110 having controlled optical characteristics. In some embodiments of the present invention it is advantageous to have multiple light sheets, each of which as a similar CCT, preferably the average CCT of each light sheet during manufacture or use having a relatively narrow CCT distribution. One measure of white color temperature is defined as a MacAdam ellipse. A MacAdam ellipse represents a region of colors on a chromaticity chart, for example the CIE chromaticity diagram, and a one-step MacAdam ellipse represents the range of colors around the center of the ellipse that are indistinguishable to the average human eye, from the color at the center of the ellipse. The contour of a one-step MacAdam ellipse therefore represents barely noticeable differences of chromaticity.

Multiple-step MacAdam ellipses may be constructed that encompass larger ranges of color around the center point. While there are many recommendations as to how tight the color temperature uniformity should be (as measured by MacAdam ellipses or other units), a variation encompassed within a smaller step number of MacAdam ellipses (smaller ellipse) is more uniform than one encompassed within a larger step number of MacAdam ellipses (larger ellipse). For example, a four-step MacAdam ellipse encompasses about a 300 K color temperature variation along the black body locus, centered at 3200 K, while a two-step MacAdam ellipse encompasses about a 150 K color temperature variation along the black body locus, centered at 3200 K.

In some embodiments of the present invention, the variation in average CCT between different light sheets 110 is less than 4 MacAdam ellipses, or less than 3 MacAdam ellipses or less than 2 MacAdam ellipses.

Substrate 165 may include or consist essentially of a semicrystalline or amorphous material, e.g., polyethylene naphthalate (PEN), polyethylene terephthalate (PET), polycarbonate, polyethersulfone, polyester, polyimide, polyethylene, fiberglass, FR4, metal core printed circuit board. (MCPCB), and/or paper, Substrate 165 may include multiple layers, for example, a semicrystalline or amorphous material, e.g., PEN, PET, polycarbonate, polyethersulfone, polyester, polyimide, polyethylene, and/or paper formed over a second substrate for example comprising, acrylic, aluminum, steel and the like. Depending upon the desired application for which embodiments of the invention are utilized, substrate 165 may be substantially optically transparent, translucent, or opaque. For example, substrate 165 may exhibit a transmittance or a reflectivity greater than 70% for optical wavelengths ranging between approximately 400 nm and approximately 700 nm. In some embodiments substrate 165 may exhibit a transmittance or a reflectivity of greater than 70% for one or more wavelengths emitted by LEEs 140. Substrate 165 may also be substantially insulating, and may have an electrical resistivity greater than approximately 100 ohm-cm, greater than approximately $1\times10^6$ ohm-cm, or even greater than approximately $1\times10^{10}$ ohm-cm. In some embodiments, substrate 165 may have a thickness in the range of about 10 μm to about 500 μm.

Conductive elements, e.g., power conductors 120, 121 and conductive traces 160, may be formed via conventional deposition, photolithography, and etching processes, plating processes, lamination, lamination and patterning, evaporation sputtering or the like or may be formed using a variety of different printing processes. For example, power conductors 120, 121 and conductive traces 160 may be formed via screen printing, flexographic printing, ink-jet printing, and/or gravure printing. Power conductors 120, 121 and conductive traces 160 may include or consist essentially of a conductive material (e.g., an ink or a metal, metal film or other conductive materials or the like), which may include one or more elements such as silver, gold, aluminum, chromium, copper, and/or carbon. Power conductors 120, 121 and conductive traces 160 may have a thickness in the range of about 50 nm to about 1000 μm. In some embodiments, the thickness of power conductors 120, 121 and conductive traces 160 may be determined by the current to be carried thereby. While the thickness of one or more of power conductors 120, 121 and conductive traces 160 may vary, the thickness is generally substantially uniform along the length of the trace to simplify processing. However, this is not a limitation of the present invention, and in other embodiments the thickness and/or material of power conductors 120, 121 and conductive traces 160 may vary. In some embodiments, all or a portion of power conductors 120, 121 and conductive traces 160 may be covered or encapsulated. In some embodiments, a layer of material, for example insulating material, may be formed over all or a portion of power conductors 120, 121 and conductive traces 160. Such a material may include, e.g., a sheet of material such as used for substrate 165, a printed layer, for example using screen, ink jet, stencil or other printing means, a laminated layer, or the like. Such a printed layer may include, for example, an ink, a plastic and oxide, or the like. The covering material and/or the method by which it is applied is not a limitation of the present invention.

In some embodiments of the present invention, all or a portion of substrate 165 and/or power conductors 120, 121 and conductive traces 160 may be covered by a layer having pre-determined optical properties. In some embodiments, the optical properties of substrate 165 or a coating material on substrate 165, for example reflectance, transmittance and absorption, may be utilized to further control the optical characteristics of the lighting system. In some embodiments, substrate 165 or a coating on substrate 165 may be a diffuse reflector, while in other embodiments it may be a specular reflector, and in yet other embodiments it may be designed to have a relatively high absorbance for light emitted by LEEs 140. In some embodiments of the present invention, substrate 165 may have a reflectance of at least 80% or at least 90% or at least 95% to a wavelength of light emitted by LEEs 140. In some embodiments of the present invention, substrate 165 may be transparent or substantially transparent to a wavelength of light emitted by LEEs 140, for example having a transmittance of at least 80% or at least 90% or at least 95% to a wavelength of light emitted by LEEs 140. In some embodiments of the present invention, substrate 165 may be absorbing or substantially absorbing to a wavelength of light emitted by LEEs 140, for example having an absorbance of at least 60% or at least 70% or at least 80% to a wavelength of light emitted by LEEs 140. In some embodiments, substrate 165 or portions of substrate 165 may be configured to diffuse a wavelength of light emitted by LEEs 140. In some embodiments, substrate 165 may have two or more regions, where different regions have different optical characteristics. In some embodiments, the transmittance of a diffuse region is at least 50%, or at least 70% or at least 80%, or at least 90% to a wavelength of light emitted by LEEs 140. The remaining portion of substrate 165 in some embodiments has a reflecting surface, i.e., it is reflecting to a wavelength of light emitted by LEEs 140.

In one embodiment, conductive traces 160 are formed with a gap between adjacent conductive traces 160, and LEEs 140 and CEs 145 are electrically coupled to conductive traces 160 using conductive adhesive, e.g., an isotropically conductive adhesive and/or an ACA, as described in U.S. Pat. No. 8,384,121, filed on Jun. 29, 2011, the entire disclosure of which is incorporated herein by reference. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments. LEEs 140 and CEs 145 may be attached to and/or electrically coupled to conductive traces 160 by other means, for example solder, reflow solder, wave solder, wire bonding, or the like. The method by which LEEs 140 and CEs 145 are attached to conductive traces 160 is not a limitation of the present invention.

CE 145 may be one component or multiple active and/or passive components. In one embodiment, power conductors 120, 121 provide a DC voltage or substantially DC voltage and CE 145 includes or consists essentially of a resistor, e.g. a current-limiting resistor. The choice of the resistance value may be a trade-off between a number of parameters and characteristics that may include, e.g., efficiency and current stability. In general, a larger resistance will result in reduced efficiency but greater current stability, while a smaller resistance will result in increased efficiency but reduced current stability, Variations in the current may result from variations in the input voltage (for example across power conductors 120, 121), variations in forward voltage of the LEEs 140 within the string, variations in the value of the current-limiting resistor, variations in current that may occur if one or more LEEs 140 in the string become short-circuited or the like. In the case of CE 145 including or consisting essentially of a resistor, in some embodiments CE 145 is a discrete resistor formed within or on conductive traces 160, such as a chip resistor, a bare-die resistor or surface mount device (SMD) resistor.

As discussed above, in embodiments where CE 145 includes or consists essentially of a resistor, there may be trade-offs between efficiency and current stability. While such trade-offs may be acceptable in certain products, other products may require relatively better current stability at higher efficiencies, and in these cases CE 145 may include or consist essentially of multiple components or a circuit element, as discussed above. In some embodiments CE 145 includes or consists essentially of a field-effect transistor (FET) and a resistor. In another embodiment CE 145 includes or consists essentially of two bipolar junction transistors (BJTs) and two resistors.

In some embodiments, the efficiency and current stability increase with the number of components, as does the cost. In some embodiments where CE 145 includes or consists essentially of multiple components, the components may be in discrete form (i.e., each component individually electrically coupled to conductive traces 160) or in hybrid form (where multiple separate components are mounted on a submount, which is then electrically coupled to conductive traces 160), or in monolithic form (where multiple components are integrated on a semiconductor chip, for example a silicon-based or other semiconductor-based integrated circuit). In some embodiments, CE 145 may be in bare-die form, while in other embodiments CE 145 may be packaged or potted or the like. In some embodiments. CE 145 may include or consist essentially of a bare-die integrated circuit. In some embodiments, the integrated circuit includes or consists essentially of multiple active and/or passive devices that are fabricated on a common semiconductor substrate.

In other embodiments, power conductors 120, 121 may provide AC power, or power modulated at different frequencies and in these embodiments CEs 145 may be selected accordingly or may be omitted. In one embodiment, power conductors 120, 121 may provide a standard line voltage, for example about 120 VAC or about 240 VAC or about 277 VAC, for example at about 50 Hz or about 60 Hz. In some embodiments, CEs 145 may accommodate a plurality of input types, and thus be so-called "universal" CEs 145, while in other embodiments different CEs 145 may be required for different input types. The actual component or components of CEs 145 are not limiting to this invention; however, in preferred embodiments of this invention, the positioning of CE 145 does not disrupt the LEE pitch. In another embodiment of this invention, the positioning of CEs 145 is independent of LEE pitch. As discussed herein, CEs 145 and LEEs 140 may be electrically coupled to conductive traces 160 using a variety of means, for example solder, conductive adhesive or anisotropic conductive adhesive (ACA); however, the method of electrical coupling of CEs 145 and LEEs 140 is not a limitation of the present invention.

In general in the above discussion the arrays of semiconductor dies, light emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:
1. A lighting system comprising:
 a substantially planar substrate having a first surface and a second surface opposite the first surface;
 first and second spaced-apart power conductors disposed over the substrate;
 a plurality of light-emitting strings disposed over the first surface of the substrate, each light-emitting string (i) comprising a plurality of interconnected light-emitting elements spaced along the light-emitting string, (ii) having a first end electrically coupled to the first power conductor, and (iii) having a second end electrically coupled to the second power conductor, wherein the power conductors supply power to each of the light-emitting strings;

a plurality of conductive traces disposed over the first surface of the substrate and each (i) electrically interconnecting two light-emitting elements, or (ii) electrically connecting a light-emitting element to a power conductor; and a polymeric top housing disposed over the first surface of the substrate and sealed to the first surface of the substrate at a contact point between the top housing and the first surface of the substrate to form a sealed region between the top housing and the substrate, the sealed region containing therewithin the plurality of light-emitting strings and at least some of the conductive traces, wherein the top housing is spaced apart from and not in contact with the light-emitting elements.

2. The lighting system of claim 1, wherein the sealed region contains therewithin at least a portion of the first power conductor and at least a portion of the second power conductor.

3. The lighting system of claim 1, wherein at least a portion of the first power conductor and at least a portion of the second power conductor are disposed over the first surface of the substrate.

4. The lighting system of claim 1, further comprising a plurality of control elements each (i) electrically connected to at least one light-emitting string and (ii) configured to utilize power supplied from the power conductors to control the current to the at least one light-emitting string to which it is electrically connected.

5. The lighting system of claim 4, wherein at least one of the control elements is disposed within the sealed region.

6. The lighting system of claim 4, further comprising a plurality of additional conductive traces disposed over the substrate and each (i) electrically connecting a light-emitting element to a control element, or (ii) electrically connecting a control element to the first power conductor or to the second power conductor.

7. The lighting system of claim 6, wherein at least some of the additional conductive traces and at least one of the control elements are disposed within the sealed region.

8. The lighting system of claim 4, wherein the plurality of control elements are disposed on the substrate.

9. The lighting system of claim 4, wherein each light-emitting string is electrically coupled to a different control element.

10. The lighting system of claim 1, wherein the lighting system is separable, via a cut spanning the first and second power conductors and not crossing a light-emitting string, into two individually operable partial lighting systems each comprising (i) one or more light-emitting strings, (ii) portions of the first and second power conductors configured to supply power to and thereby illuminate the one or more light-emitting strings of the partial lighting system, and (iii) a second sealed region defined by a seal between a portion of the top housing and the substrate.

11. The lighting system of claim 1, wherein the first and second power conductors are disposed entirely within the sealed region.

12. The lighting system of claim 11, wherein the power supply is configured to provide a substantially constant voltage to the first and second power conductors.

13. The lighting system of claim 1, further comprising, electrically connected to the first and second power conductors, a power supply for powering the light-emitting elements.

14. The lighting system of claim 1, wherein at least a portion of the sealed region contains therewithin air, an inert gas, and/or a material that is transparent or substantially transparent to a wavelength of light emitted by the light-emitting elements.

15. The lighting system of claim 1, wherein a top surface of the polymeric top housing is flat in regions disposed over the light-emitting elements.

16. The lighting system of claim 1, further comprising a polymeric bottom housing disposed over the second surface of the substrate, at least a portion of the bottom housing contacting the second surface of the substrate to form a second sealed region disposed between the bottom housing and the second surface of the substrate.

17. The lighting system of claim 1, further comprising, extending from within the sealed region to outside of the sealed region, one or more conductive couplings for supplying power from an external power source to the light-emitting strings.

18. The lighting system of claim 17, wherein at least one conductive coupling comprises an electrical connector terminating outside of the sealed region and configured to receive a complementary connector or wire electrically connected to the external power source.

19. The lighting system of claim 18, wherein the lighting system has an ingress protection rating of at least IP 65, as specified by International Protection Marking in International Electrotechnical Commission (IEC) standard 60529.

20. The lighting system of claim 17, wherein at least one conductive coupling comprises a conductive element piercing through at least one of the top housing or the substrate and making electrical contact to at least one of the first or second power conductors.

21. The lighting system of claim 1, further comprising at least one of (i) control circuitry configured to control at least one emission characteristic of the light-emitting elements, or (ii) communication circuitry configured to transmit information to or from the lighting system.

22. The lighting system of claim 21, wherein (i) the lighting system comprises control circuitry configured to control at least one emission characteristic of the light-emitting elements, and (ii) the at least one emission characteristic comprises at least one of a correlated color temperature, a color rendering index, R9, a luminous flux, a light output power, a spectral power density, a radiant flux, a light-distribution pattern, or an angular color uniformity.

23. The lighting system of claim 1, further comprising, extending from within the sealed region to outside of the sealed region, one or more conductive couplings configured to convey a communication or control signal to or from the light sheet.

24. The lighting system of claim 1, wherein the top housing comprises at least one of polyester, acrylic, polystyrene, polyethylene, polyimide, polyethylene naphthalate, polyethylene terephthalate, polypropylene, polycarbonate, acrylonitrile butadiene styrene, polyurethane, silicone, or polydimethylsiloxane.

25. The lighting system of claim 1, wherein a weight per area of the lighting system is less than 5 kg/m$^2$.

26. The lighting system of claim 1, wherein a thickness of the lighting system is less than 15 mm.

27. The lighting system of claim 1, wherein at least a portion of the top housing is configured as a diffuser for a wavelength of light emitted by the light-emitting elements.

28. The lighting system of claim 1, wherein a transmittance of the top housing for a wavelength of light emitted by the light-emitting elements is greater than 90%.

29. The lighting system of claim 1, wherein the light-emitting elements in each of the light-emitting strings are separated at a substantially constant pitch.

30. The lighting system of claim 1, wherein at least one light-emitting element comprises a light-emitting diode.

31. The lighting system of claim 1, wherein at least one light-emitting element emits substantially white light.

32. The lighting system of claim 1, further comprising a desiccant disposed in the sealed region.

33. The lighting system of claim 1, wherein at least one of the light-emitting elements incorporates a light-conversion material for conversion of at least a portion of light emitted by the at least one of the light-emitting elements to light having a different wavelength.

34. A lighting system comprising:
a substantially planar substrate having a first surface and a second surface opposite the first surface;
first and second spaced-apart power conductors disposed over the substrate;
a plurality of light-emitting strings disposed over the first surface of the substrate, each light-emitting string (i) comprising a plurality of interconnected light-emitting elements spaced along the light-emitting string, (ii) having a first end electrically coupled to the first power conductor, and (iii) having a second end electrically coupled to the second power conductor, wherein the power conductors supply power to each of the light-emitting strings;
a plurality of conductive traces disposed over the first surface of the substrate and each (i) electrically interconnecting two light-emitting elements, or (ii) electrically connecting a light-emitting element to a power conductor; and
a polymeric bottom housing disposed over the second surface of the substrate and sealed to the second surface of the substrate at a contact point between the bottom housing and the second surface of the substrate to form a sealed region between the substrate and the bottom housing.

35. The lighting system of claim 34, wherein the lighting system is separable, via a cut spanning the first and second power conductors and not crossing a light-emitting string, into two individually operable partial lighting systems each comprising (i) one or more light-emitting strings, (ii) portions of the first and second power conductors configured to supply power to and thereby illuminate the one or more light-emitting strings of the partial lighting system, and (iii) a sealed region defined by a seal between a portion of the bottom housing and the substrate.

36. The lighting system of claim 34, wherein the shaped region contains therewithin air and/or an inert gas.

37. The lighting system of claim 34, further comprising a plurality of control elements each (i) electrically connected to at least one light-emitting string and (ii) configured to utilize power supplied from the power conductors to control the current to the at least one light-emitting string to which it is electrically connected.

38. The lighting system of claim 37, wherein each light-emitting string is electrically coupled to a different control element.

39. The lighting system of claim 34, further comprising one or more conductive couplings for supplying power from an external power source to the light-emitting strings.

40. The lighting system of claim 39, wherein at least one conductive coupling comprises a conductive element piercing through at least one of the bottom housing or the substrate and making electrical contact to at least one of the first or second power conductors.

41. The lighting system of claim 34, further comprising one or more conductive couplings configured to convey a communication or control signal to or from the light sheet.

42. The lighting system of claim 41, wherein at least one said conductive coupling extends from within the sealed region to outside of the sealed region.

43. The lighting system of claim 41, wherein the communication or control signal comprises at least one of a light-intensity level, a correlated color temperature, a color rendering index, a luminous-intensity distribution, or an operational state of the light sheet.

44. The lighting system of claim 34, wherein (i) the lighting system comprises control circuitry configured to control at least one emission characteristic of the light-emitting elements, and (ii) the at least one emission characteristic comprises at least one of a correlated color temperature, a color rendering index, R9, a luminous flux, a light output power, a spectral power density, a radiant flux, a light-distribution pattern, or an angular color uniformity.

45. The lighting system of claim 34, wherein the bottom housing comprises at least one of polyester, acrylic, polystyrene, polyethylene, polyimide, polyethylene naphthalate, polyethylene terephthalate, polypropylene, polycarbonate, acrylonitrile butadiene styrene, polyurethane, silicone, or polydimethylsiloxane.

46. The lighting system of claim 34, wherein a weight per area of the lighting system is less than 5 kg/m'.

47. The lighting system of claim 34, wherein a thickness of the lighting system is less than 15 mm.

48. The lighting system of claim 34, wherein at least a portion of the bottom housing is configured as a diffuser for a wavelength of light emitted by the light-emitting elements.

49. The lighting system of claim 34, wherein a transmittance of the bottom housing for a wavelength of light emitted by the light-emitting elements is greater than 90%.

50. The lighting system of claim 34, wherein the light-emitting elements in each of the light-emitting strings are separated at a substantially constant pitch.

51. The lighting system of 34, wherein at least one light-emitting element comprises a light-emitting diode.

52. The lighting system of claim 34, wherein at least one light-emitting element emits substantially white light.

53. The lighting system of claim 34, further comprising a desiccant disposed in the sealed region.

54. The lighting system of claim 34, wherein at least one of the light-emitting elements incorporates a light-conversion material for conversion of at least a portion of light emitted by the at least one of the light-emitting elements to light having a different wavelength.

* * * * *